(12) United States Patent
Kuo et al.

(10) Patent No.: US 11,953,725 B2
(45) Date of Patent: Apr. 9, 2024

(54) GRATING COUPLER AND METHOD OF MANUFACTURING THE SAME

(71) Applicant: Taiwan Semiconductor Manufacturing Company, Ltd., Hsinchu (TW)

(72) Inventors: Feng-Wei Kuo, Zhudong Township (TW); Chewn-Pu Jou, Hsinchu (TW); Hsing-Kuo Hsia, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 17/446,669

(22) Filed: Sep. 1, 2021

(65) Prior Publication Data

US 2022/0404552 A1  Dec. 22, 2022

Related U.S. Application Data

(60) Provisional application No. 63/212,408, filed on Jun. 18, 2021.

(51) Int. Cl.
*G02B 6/12* (2006.01)
*G02B 6/124* (2006.01)
*G02B 6/132* (2006.01)
*H01S 5/026* (2006.01)

(52) U.S. Cl.
CPC ......... *G02B 6/12019* (2013.01); *G02B 6/124* (2013.01); *G02B 6/132* (2013.01); *H01S 5/026* (2013.01); *G02B 2006/12121* (2013.01)

(58) Field of Classification Search
CPC .... G02B 6/12019; G02B 6/124; G02B 6/132; G02B 2006/12121; H01S 5/026
USPC ......................................................... 385/37
See application file for complete search history.

(56) References Cited

U.S. PATENT DOCUMENTS

| 10,746,925 | B2 | 8/2020 | Jacob et al. | |
|---|---|---|---|---|
| 2013/0259420 | A1* | 10/2013 | Yoshida | G02B 6/12004 385/14 |
| 2014/0314374 | A1* | 10/2014 | Fattal | G02B 5/1861 385/33 |
| 2018/0113313 | A1* | 4/2018 | Tekolste | G02B 5/1861 |
| 2021/0018690 | A1* | 1/2021 | Bian | G02B 6/124 |

OTHER PUBLICATIONS

Xia Chen et al., "Apodized Waveguide Grating Couplers for Efficient Coupling to Optical Fibers", IEEE Photonics Technology Letters, vol. 22, No. 15, Aug. 1, 2020 (pp. 1156-1158).

(Continued)

*Primary Examiner* — Jerry M Blevins
(74) *Attorney, Agent, or Firm* — Finnegan, Henderson, Farabow, Garrett & Dunner. L.L.P

(57) ABSTRACT

A device includes a dielectric layer, a plurality of grating structures, and a dielectric material between the plurality of grating structures and on top of the plurality of grating structures. The grating structures are arranged on the dielectric layer and separated from each other, the plurality of grating structures each having a bottom portion and top portion, the top portion having a first width and the bottom portion having a second width, the second width being larger than the first width.

20 Claims, 18 Drawing Sheets

(56) References Cited

OTHER PUBLICATIONS

Jianxun Hong et al., "A high efficiency silicon nitride waveguide grating coupler with a multilayer bottom reflector", Scientific Reports, Sep. 10, 2019, www.nature.com/scientificreports.

Lirong Chen et al., "Grating Couplers on Silicon Photonics: Design Principles, Emerging Trends and Practical Issues", Micromachines, Jul. 8, 2020.

Kehan Zhu et al., "Behavioral Modeling and Characterization of Silicon Photonic Mach-Zehnder Modulator", AMPIC Lab, University of Idaho, now with Multiphy, Hellertown, PA; Department of ECE, University of Idaho, Moscow, ID, IEEE, 2017 (pp. 989-992).

* cited by examiner

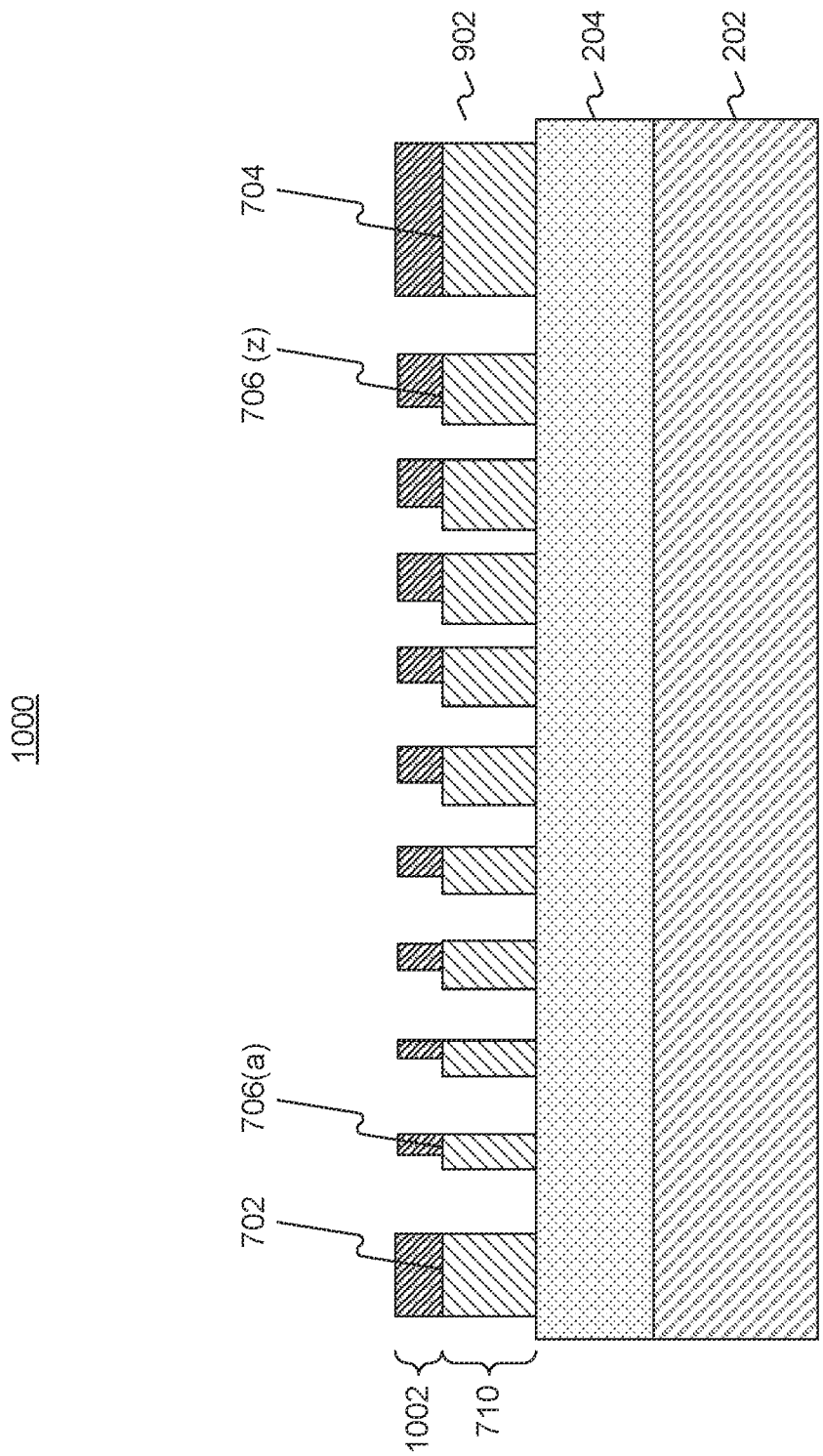

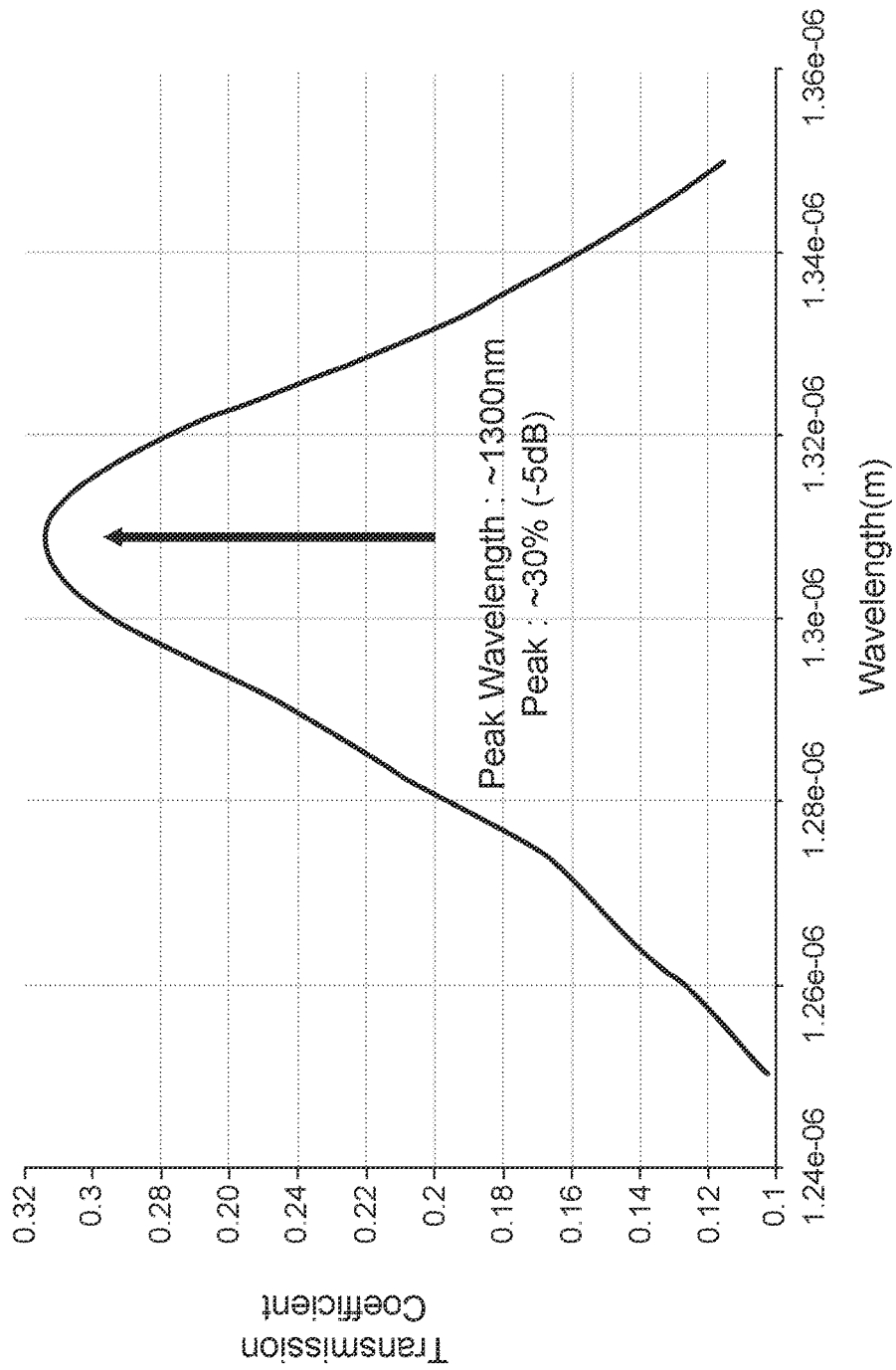

GRATING COUPLER AND METHOD OF MANUFACTURING THE SAME

TECHNICAL FIELD

The disclosure relates to integrated photonics and, more particularly, to a grating coupler for photonics applications.

BACKGROUND

Integrated photonics involve integrating optical structures within substrates or on surfaces of electronic devices and systems. For example, integrated photonics encompass the design and fabrication of electronic/photonic devices and their integration on a chip. Integrated photonics allow low-cost and efficient communication between traditional electronics (such as CMOS technology) and light-based communications (such as optical fiber communications). As a result of this integration, optical structures can be connected, between themselves or to electronic components, to create photonic circuits that can process and transmit light in ways similar to how integrated circuits process and transmit electronic signals. Such photonic circuits may include on-chip optical interconnects, waveguides, and light-coupling devices fabricated within (or on top of) the surface of CMOS chips. These optical components may be configured to guide light through a chip and couple light signals and electronic processing. Integrated photonics have found applications in a wide range of areas, including data center architecture, analog signal processing, electronic sensors, LIDAR, and telecommunications, among others.

One of the components used in integrated photonics is the grating coupler. The grating coupler is a varying arrangement of different materials or structures on a surface that provides light coupling to on-chip waveguides or other optical components. Grating couplers are also used to facilitate alignment with optical fibers and are designed to couple light of specific frequency or wavelength. In particular, grating couplers are fabricated with specific periodicity and alternation of materials to create a refractive index variation that causes incoming light of a selected frequency to be diffracted and coupled to other photonic devices. The grating coupler may be designed to have a single coupling direction, such that light is coupled in the direction of the index variation or varied directionality in a diffraction regime.

The disclosed devices, apparatus, systems, and methods for grating couplers are directed to improve grating couplers and/or to address one or more problems or challenges in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12 illustrate cross-section views of an exemplary manufacturing process for forming a waveguide and grating coupler in accordance with embodiments of the present disclosure.

FIG. 2 shows a cross-sectional view of a first structure formed during the exemplary manufacturing process.

FIG. 3 shows a cross-sectional view of a second structure formed during the exemplary manufacturing process.

FIG. 4 shows a cross-sectional view of a third structure formed during the exemplary manufacturing process.

FIG. 5 shows a cross-sectional view of a fourth structure formed during the exemplary manufacturing process.

FIG. 6 shows a cross-sectional view of a fifth structure formed during the exemplary manufacturing process.

FIG. 7 shows a cross-sectional view of a sixth structure formed during the exemplary manufacturing process.

FIG. 8 shows a cross-sectional view of a seventh structure formed during the exemplary manufacturing process.

FIG. 9 shows a cross-sectional view of an eight structure formed during the exemplary manufacturing process.

FIG. 10A shows a cross-sectional view of a ninth structure formed during the exemplary manufacturing process.

FIG. 11 shows a cross-sectional view of an eleventh structure formed during the exemplary manufacturing process.

FIG. 12 shows a cross-sectional view of a twelfth structure formed during the exemplary manufacturing process.

FIG. 16A shows an exemplary transmission characteristic of a grating coupler having a single etch in accordance with embodiments of the present disclosure.

DETAILED DESCRIPTION

Figure 1:
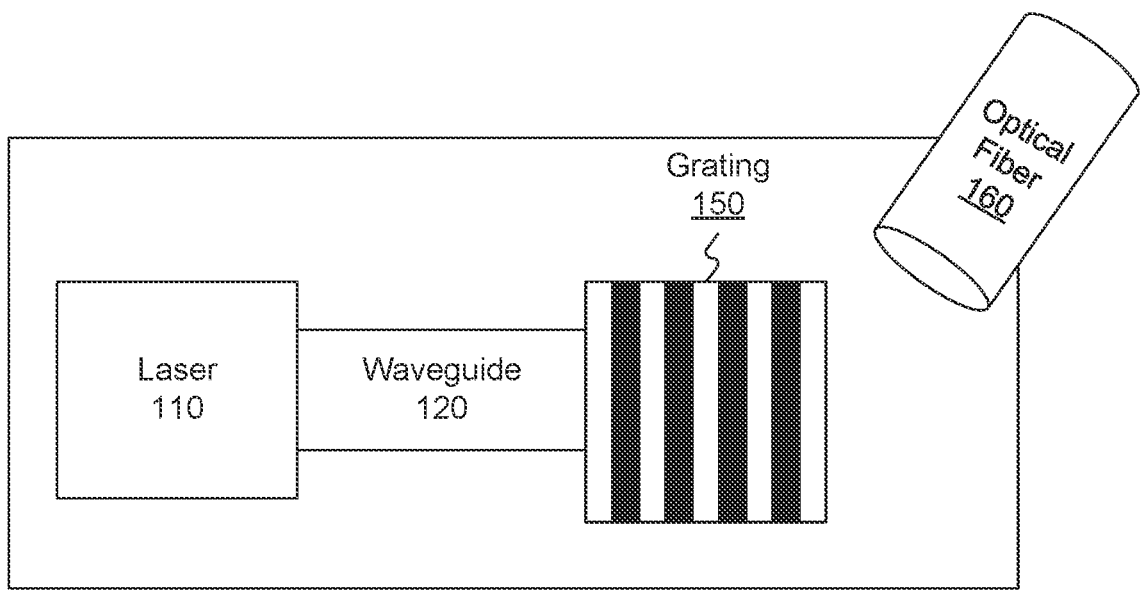
FIG. 1 shows a top-view diagram of a photonics circuit and an optical fiber in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, connectivity terms such as "connected," "coupled," "joined," "attached," and the like, may be used herein for ease of description to describe elements that have an electrical, electromagnetic, radio frequency, or ultrasonic connectivity. Moreover, connectivity terms may denote general electrical or magnetic communication between components. These connectivity terms may denote a direct connection (i.e., two components being connected without any intervening element) or an indirect connection (i.e., two components being connected through one or more intervening elements).

FIG. 1 shows a top-view diagram of a photonics circuit 100 in accordance with some embodiments of the present disclosure. Photonics circuit 100 includes a laser 110, a waveguide 120, and a grating coupler 150. As shown in FIG. 1, waveguide 120 couples laser 110 with grating coupler 150. Additionally or alternatively, waveguide 120 couples grating coupler 150 or laser 110 with other components of photonics circuit 100 (not shown), such as on-chip optical interconnects, electronic device structures, and/or photonic device structures. In photonics circuit 100, an optical fiber 160 is arranged over the grating coupler 150. As further discussed in connection with FIG. 13, a distance and angle of incidence of optical fiber 160 relative to grating coupler 150 may be selected to enhance coupling efficiency and minimize losses. Optical fiber 160 may supply light signals to grating coupler 150 or receive light signals from grating coupler 150. For example, grating coupler 150 may couple light signals from waveguide 120 to optical fiber 160. Additionally or alternatively, grating coupler 150 may receive light signals coming from optical fiber 160 and couple the light signals to on-chip components, transmitting them to waveguide 120 or other on-chip photonic structures.

Laser 110, grating coupler 150, and waveguide 120 are located on a substrate. As further discussed in connection with FIG. 2, the substrate may be formed with a semiconducting device or a dielectric material. Further, optical fiber 160 may have a core surrounded by a cladding of lower refractive index.

As further discussed below in connection with FIG. 12, grating coupler 150 may be formed with a periodic arrangement of dielectric regions that are arranged in a set of grating structures separated by trenches that are formed on a material. In some embodiments, the material of the grating structures in grating coupler 150 may be the same as the material of waveguide 120. In other embodiments, grating coupler 150 may have a different material than waveguide 120. Further, grating coupler 150 may include a group of parallel linear features having a pitch, dimensions, and width selected for coupling light of a specified wavelength. In such embodiments, grating coupler 150 may include a periodic arrangement of grating structures that are arranged above, over, or within a dielectric material. For example, the period between grating structures (separated by trenches) in grating coupler 150 may be less than 600 nm when the targeted wavelength is 1310 nm.

In some embodiments, grating coupler 150 may be formed in a region on top of or below waveguide 120. For example, grating coupler 150 may be formed in the top-most portion of waveguide 120 creating a grating coupling interface with other light elements, like fibers. Grating coupler 150 may operate with off-resonance light incident such that grating coupler 150 behaves almost the same as the light would if it was incident in an area where there is no grating. In some embodiments, grating coupler 150 has only a few periods of grating structures, so light can be coupled into the waveguide, but not back out. In such embodiments, light is guided in waveguide 120 until it reaches a waveguide edge, or an additional coupling element, which will couple the light out. The larger the diffraction efficiency of grating coupler 150, the larger percentage of light that can be coupled in. As further discussed below, disclosed embodiments provide structures and fabrication methods that result in improved coupling efficiency.

While FIG. 1 shows grating coupler 150 coupling with an on-chip waveguide 120, grating coupler 150 may also be used for coupling light with an off-chip device. In such embodiments, if the grating is used as a coupling-out element, the larger the diffraction efficiency, the fewer periods of grating structures needed to couple the light out.

FIGS. 2-12 illustrate exemplary manufacturing process steps for forming a grating structure in accordance with embodiments of the present disclosure. The manufacturing processing steps of FIGS. 2-12 are exemplary and alternative sequences or alternative steps, are possible. For example, one or more of the steps illustrated in FIGS. 2-12 may be substituted with a different process. Additionally or alternatively, the sequence of steps illustrated in FIGS. 2-12 may be altered or combined, having a step executed at the same time with other or at a different point in the sequence. Further, it is to be understood that relative to the processing operations illustrated in FIGS. 2-12, additional operations can be provided before, during, or after processes represented in these figures. Additionally or alternatively, some of the operations and processes described below can be replaced or eliminated in certain instances. And the order of the operations/processes may be interchangeable.

Figure 2:
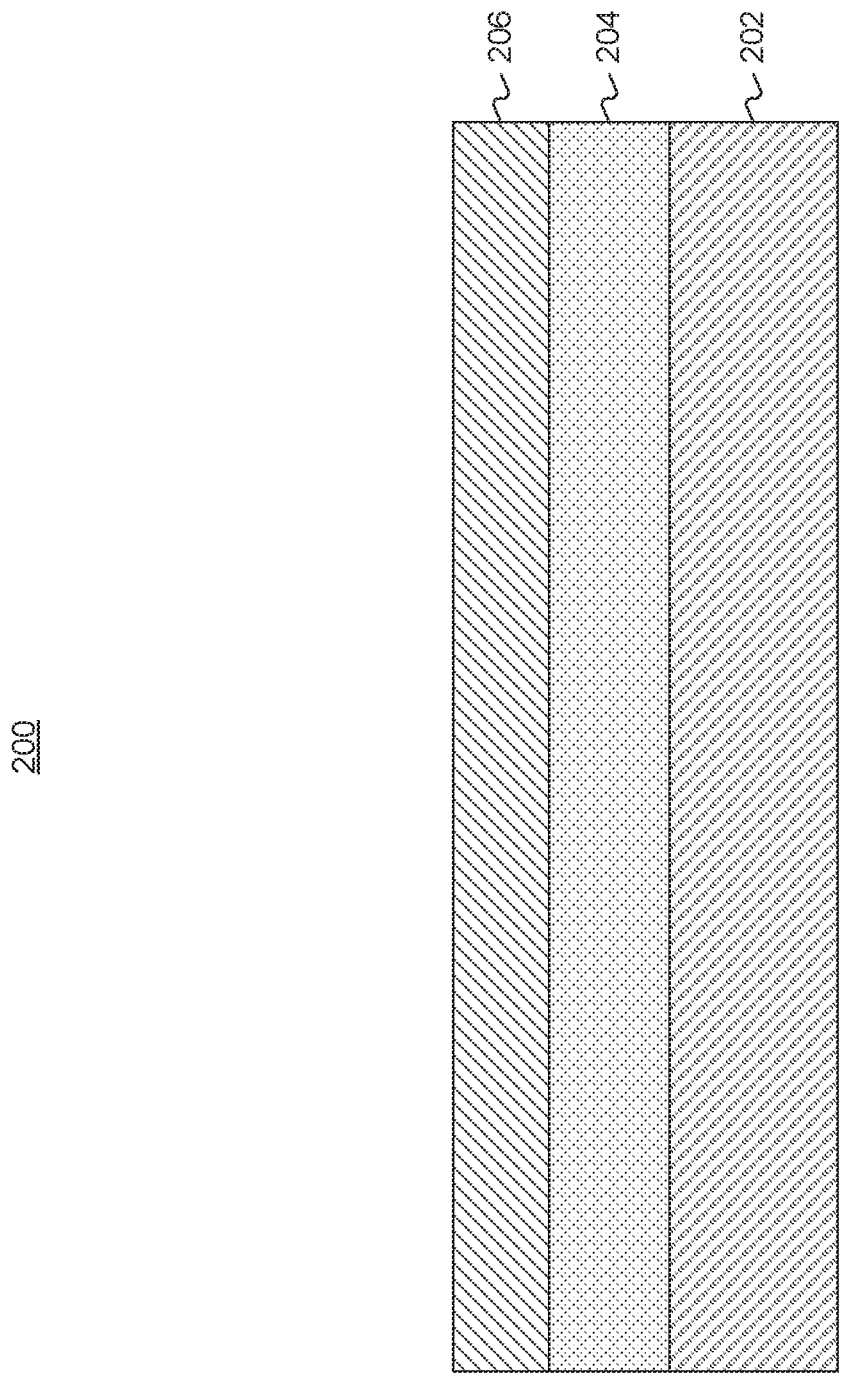

FIG. 2 shows a cross-sectional view of a first structure 200 formed during an exemplary manufacturing process for forming waveguide 120 and grating coupler 150 in accordance with some embodiments of the present disclosure. The exemplary manufacturing process may initiate with a first step of depositing a second dielectric material 206 over a first dielectric material 204 that is on top of a substrate 202. For example, the process may initiate with a silicon substrate 202 that has been oxidized to form a layer of first dielectric material 204 and a layer of silicon nitride deposited thereon to form second dielectric material 206 to from first structure 200. However, as described below, alternative compositions, materials, and processing steps are possible.

Substrate 202 may comprise another elementary semiconductor, such as germanium. Further substrate 202 may comprise a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaAs, GaP, and/or GaAsP; or combinations thereof. In certain embodiments, substrate 202 may be a semiconductor on insulator (SOI). Substrate 202 may also include a doped epi layer, a gradient semiconductor layer, and/or a semiconductor layer overlying another semiconductor layer of a different type, such as a silicon layer on a silicon germanium layer. Further, substrate 202 may be a p-type or an n-type substrate depending on design requirements of the photonic circuit 100. For example, substrate 202 may be an intrinsic substrate, a p-type substrate including a P-type dopant such as boron, gallium, indium, other suitable p-type dopants, or combinations thereof. In other embodiments, substrate 202 may include an n-type doped substrate including an n-type dopant such as phosphorus, arsenic, other suitable n-type dopants, or combinations thereof. Additionally or alternatively, substrate 202 may include on or more p-type doped regions and/or n-type doped regions. Doping may be implemented using a process such as ion implantation or diffusion in various steps and techniques.

First dielectric material 204 may include a dielectric layer of silicon oxide, silicon nitride, silicon oxynitride, high-k dielectrics, other suitable materials, or combinations thereof. In certain embodiments, first dielectric material 204 may include TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bis-benzocyclobutenes), polyimide, other suitable materials, or combinations thereof. Further, although shown as a single layer, in certain embodiments first dielectric material 204 may have a multilayer structure. First dielectric material 204 may be formed by a technique including spin-on coating, chemical vapor deposition (CVD), atomic layer deposition (ALD), sputtering, or other suitable processes. In some embodiments, first dielectric material 204 includes a silicon oxide layer having a thickness equal to or more than 2 um and equal to or less than 10 um.

As previously discussed, in some embodiments second dielectric material 206 may include silicon nitride. In other embodiments, second dielectric material 206 may include a high-k dielectric, a polymer, a silicon oxide, a silicon oxynitride, a metal oxide, among other materials. In some embodiments, as shown in FIG. 2, second dielectric material 206 may be formed over the entire first dielectric material 204, which covers the entire surface of substrate 202. In other embodiments, however, second dielectric material 206 may be selectively patterned or grown on first dielectric material 204. Second dielectric material 206 may be formed over first dielectric material 204 by any CVD process, including plasma enhanced CVD, low-pressure CVD, atmospheric pressure CVD, ultrahigh vacuum CVD, and/or subatmospheric CVD. Further, in certain embodiments, dielectric material 206 may be formed by alternative processes such as spin-on coating, sputtering, or other suitable processes.

Figure 3:
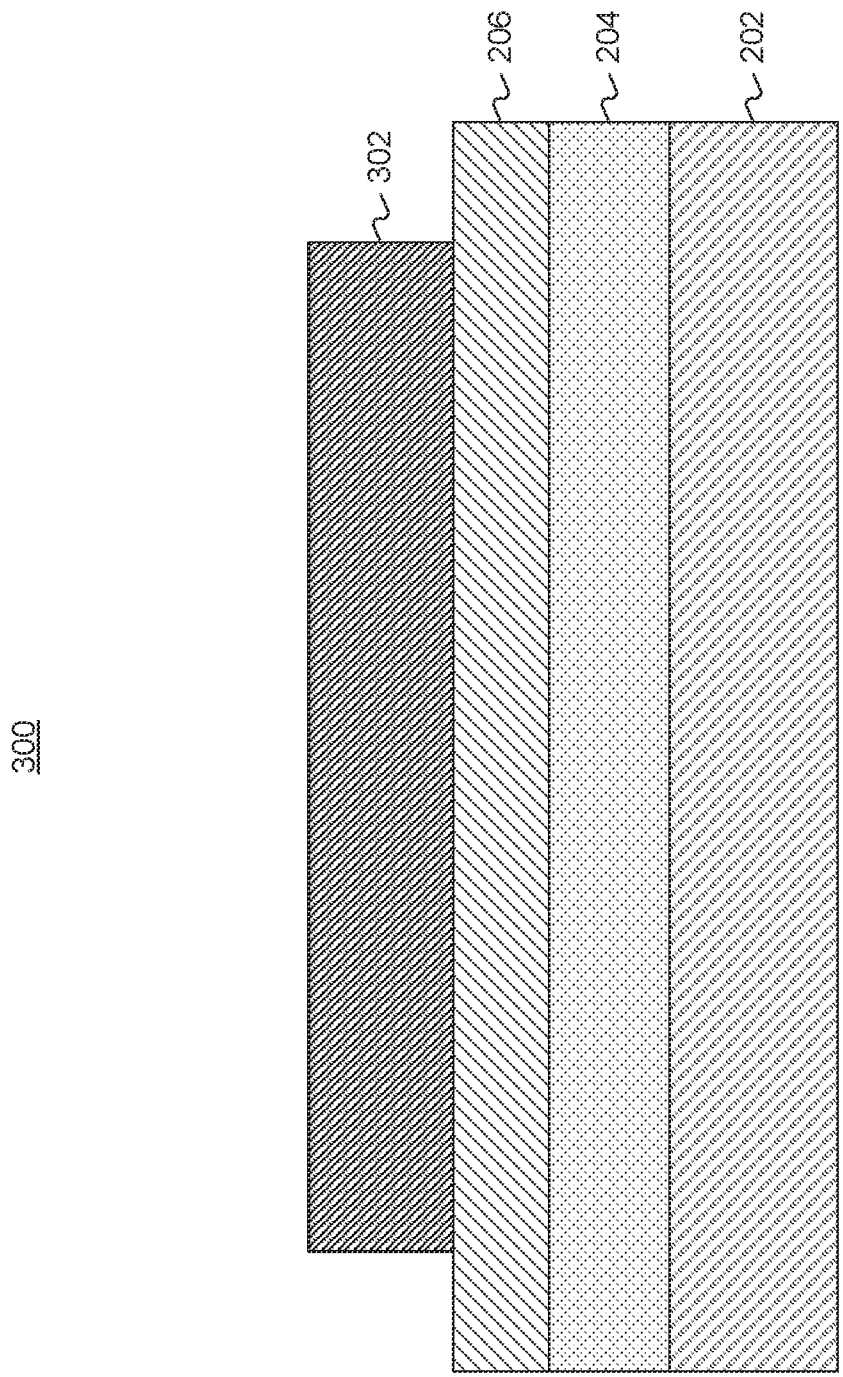

FIG. 3 shows a cross-sectional view of a second structure 300 formed during an exemplary manufacturing process for forming waveguide 120 and grating coupler 150 in accordance with some embodiments of the present disclosure. Structure 300 has the same elements as structure 200 but further includes a mask layer 302 formed thereon to protect second dielectric material 206 in regions that will form a waveguide and grating coupler, such as waveguide 120 and grating coupler 150 (FIG. 1).

Mask layer 302 may be patterned over second dielectric material 206. In some embodiments, forming patterned mask layer 302 may include applying a photoresist layer over second dielectric material 206, performing photolithography to form openings in the photoresist (i.e., exposing portions of second dielectric material 206), and etching regions of mask layer 302 using a developer reagent. For example, an exemplary patterning process includes spin coating or roll-type coating of a photoresist layer, soft baking of the photoresist layer, mask aligning, exposure of photoresist, post-exposure baking, developing the photoresist layer, rinsing, and drying (e.g., hard baking). After the patterning process, mask layer 302 is disposed on top of dielectric material 206, as shown in FIG. 3. Thus, in preparation to pattern second dielectric material 206 and form a waveguide, such as waveguide 120 (FIG. 1), mask layer 302 may be hard-baked on portions that should be protected during the etching formation of the waveguide while being removed from portions of dielectric material 206 that will be etched during the formation of the waveguide.

Alternative processes are possible to form mask layer 302. For example, instead of creating a photoresist mask, mask layer 302 may be formed as a hard mask using dielectric materials, metals, metal oxides, and/or polysilicon. For example, instead of being formed with spin-coated photoresist, mask layer 302 may be formed with a metal mask that is selectively deposited or etched over specific portions of second dielectric material 206. For instance, forming mask layer 302 may include patterning photoresist for a lift-off process, depositing a metal or dielectric layer, and performing the lift-off process to form mask layer 302. Further mask layer 302 may be formed using methods that need no UV exposure, such as e-beam lithography.

Figure 4:
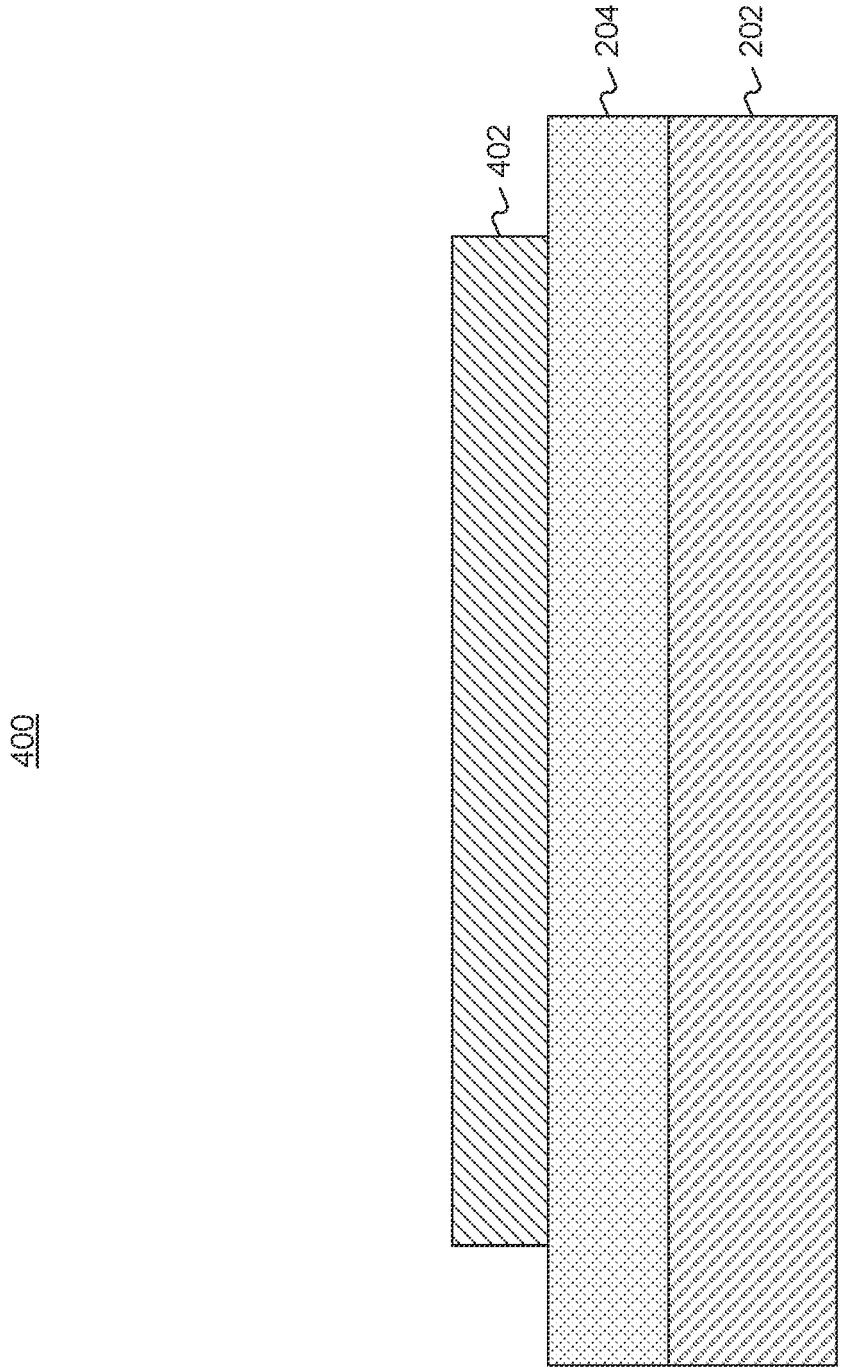

FIG. 4 shows a cross-sectional view of a third structure 400 formed during the exemplary manufacturing process for forming waveguide 120 and grating coupler 150 in accordance with some embodiments of the present disclosure. Third structure 400 includes substrate 202 and first dielectric material 204. In addition, third structure 400 has a patterned dielectric 402. In some embodiments, patterned dielectric 402 may be formed as a portion of waveguide 120 and a substrate for grating coupler 150 (FIG. 1).

Patterned dielectric 402 of third structure 400 shows dielectric material 206 having been patterned, based on mask layer 302 and mask layer 302 and then etched. For example, after mask layer 302 is patterned, dielectric material 206 may be etched using a selective etchant. For example, in embodiments in which dielectric material 206 includes or is silicon nitride, the etchant used to etch second dielectric material 206 may be a highly selective etchant to silicon nitride. The etching of second dielectric material 206, to form patterned dielectric 402, may include use of isotropic or anisotropic etchants. For example, dielectric material 206 may be etched with anisotropic etch processes, such as reactive ion etching (RIE), deep RIE, plasma etching, and/or anisotropic wet etching. Additionally or alternatively, etching second dielectric material 206 may involve applying isotropic etching techniques, using isotropic wet etchants and/or chemical dry etching.

While FIG. 4 only shows patterned dielectric 402, third structure 400 may include additional components over first dielectric material 204. For example, third structure 400 may include electronic devices such as transistors in other portions of substrate 202. Further, alternative photonics components may be integrated in third structure 400. Moreover, while FIG. 4 shows patterned dielectric 402 as a single piece, patterned dielectric 402 may have multiple pieces, different structures and multiple shapes, forms, or regions.

Figure 5:
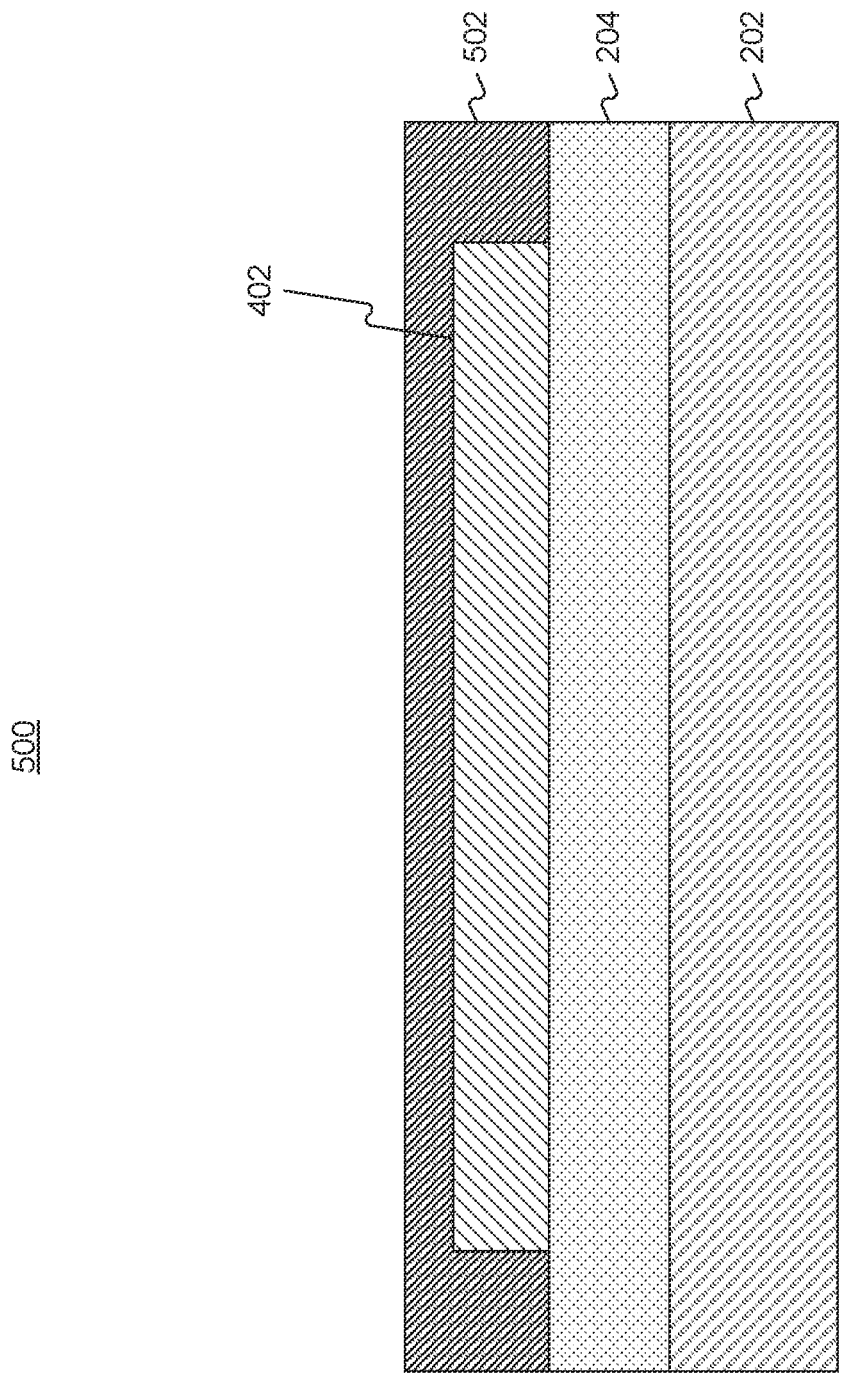

FIG. 5 shows a cross-sectional view of a fourth structure 500 formed during the exemplary manufacturing process for forming waveguide 120 and grating coupler 150 in accordance with some embodiments of the present disclosure. Fourth structure 500 has the same elements as third structure 400 but further includes a masking layer 502 covering at least a portion of the surface of first dielectric material 204 and at least a portion of the patterned dielectric 402. In some embodiments, masking layer 502 may be formed as a photoresist spin coat or roll-type coating. In other embodiments, masking layer 502 may be formed with alternative layers that can be used for further forming grating structures on patterned dielectric 402. For example, masking layer 502 may be formed with other than photoresist spin-coat materials, such as silica thin films. Further, masking layer 502 may be formed as a conformal layer of a dielectric material (to form a hard mask) and/or with sputtered metals or oxides. And masking layer 502 may be patterned through e-beam or laser lithography. In general, masking layer 502 may be formed with any material that has different etching properties when compared with patterned dielectric 402 to enable the selective etch of patterned dielectric 402.

Figure 6:
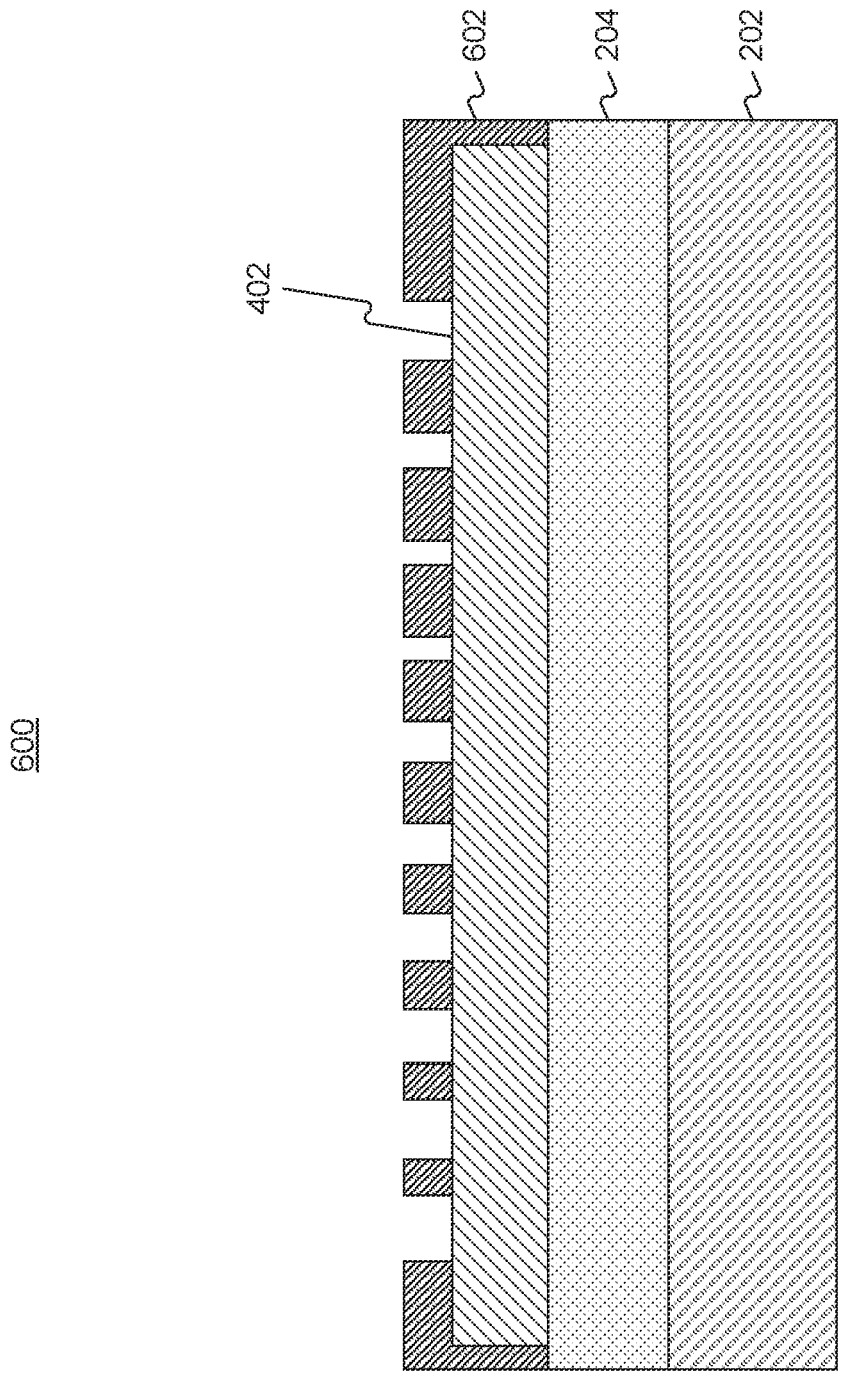

FIG. 6 shows a cross-sectional view of a fifth structure 600 formed during the exemplary manufacturing process for forming waveguide 120 and grating coupler 150 in accordance with some embodiments of the present disclosure. Like fourth structure 500, fifth structure 600 also includes substrate 202, first dielectric material 204, and patterned dielectric 402. In fifth structure 600, however, masking layer 502 has been etched or patterned to form a first grating mask 602.

Once masking layer 502 is deposited, it may be patterned to form first grating mask 602 using any suitable method. For example, when masking layer 502 includes photoresist, masking layer 502 may be patterned by performing photolithography (as described above in connection with FIG. 4) to form openings in the photoresist that expose portions of patterned dielectric 402 for forming grating structures. An exemplary patterning process includes soft baking of the photoresist layer, mask aligning, exposure, post-exposure baking, developing the photoresist layer, rinsing, and drying (e.g., hard baking). Alternative lithography processes, such as e-beam or laser mask-less lithography can also be employed to pattern masking layer 502.

Other embodiments, however, may include materials different than photoresist for masking layer 502 and patterning them may include alternative processes. For example, in embodiments in which masking layer 502 is a dielectric or metal, forming grating mask 602 may involve etching of masking layer 502. For example, grating mask 602 may be formed by selectively etching portions of masking layer 502 using a protective layer and dry etching. Further, certain embodiments may include alternative microfabrication processes, including mask-less lithography like e-beam lithography or laser ablation.

Figure 7:
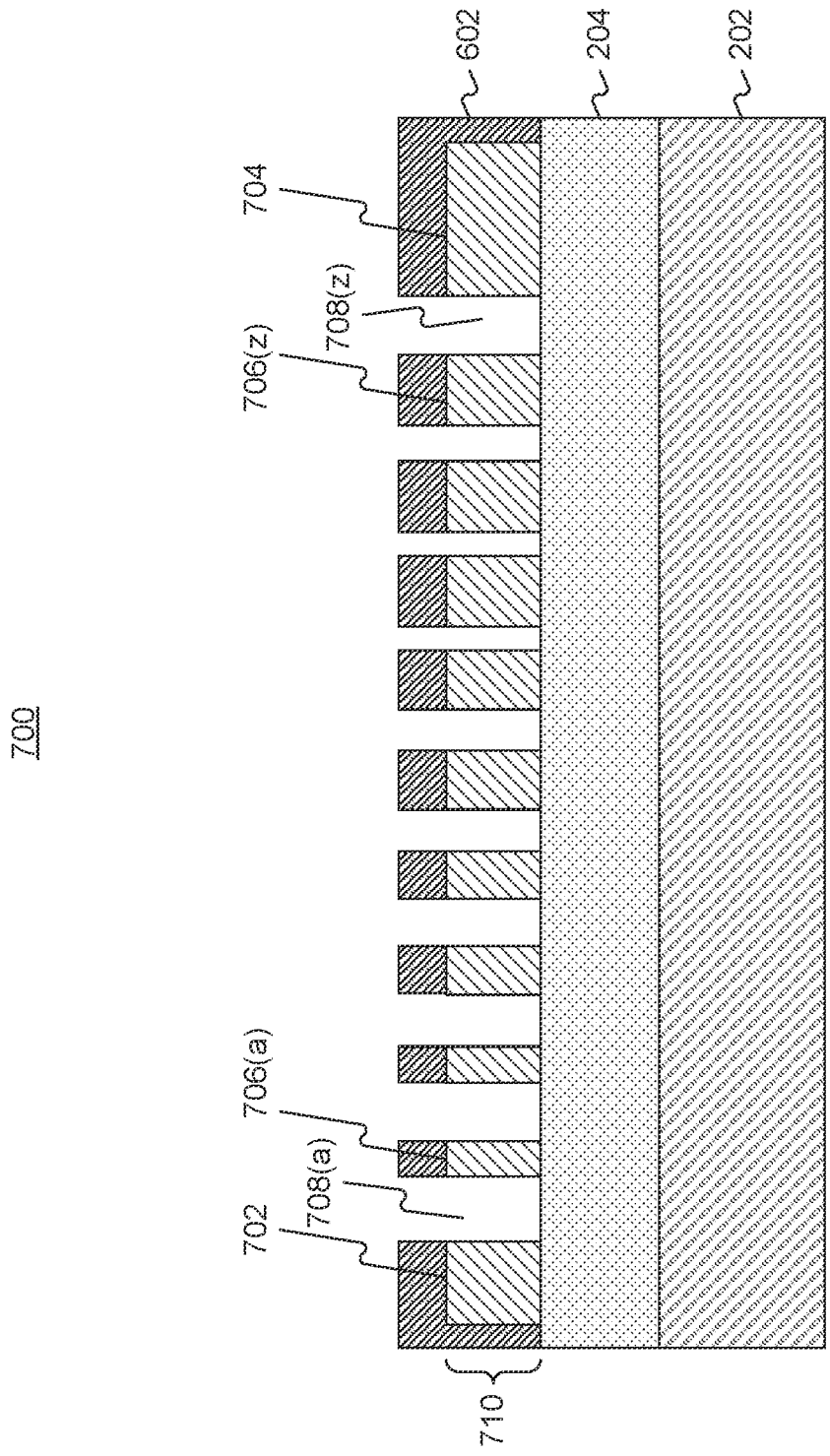

FIG. 7 shows a cross-sectional view of a sixth structure 700 formed during the exemplary manufacturing process for forming waveguide 120 and grating coupler 150 in accordance with some embodiments of the present disclosure. Sixth structure 700 also includes substrate 202, first dielectric material 204, and grating mask 602. After an etching process, sixth structure has a waveguide and coupler 710 formed from patterned dielectric 402.

The formation of grating mask 602 exposes portions of patterned dielectric 402. These exposed portions can be etched using an anisotropic etching process to form waveguide and coupler 710. Etching patterned dielectric 402 may involve reactive ion etching (RIE), deep RIE, and/or plasma etching, among others. Further, for certain embodiments, and depending on the material used for dielectric material 206 (FIG. 2), etching of patterned dielectric 402 may employ wet etching, chemical etching, or physical dry etching. In some embodiments, the etchant and etching process used to form structure 400 (FIG. 4) may be the same etchant used for structure 700. In other embodiments, the processes for etching may vary.

The selective etch of patterned dielectric 402, in regions unprotected by grating mask 602 results in the formation of trenches and hills in the patterned dielectric 402 that comprise waveguide and coupler 710. In some embodiments, as shown in FIG. 7, the patterned dielectric 402 may be etched fully until reaching first dielectric material 204. In other embodiments, patterned dielectric 402 may be only partially etched leaving some portion of the patterned dielectric 402 at the bottom of the trenches in waveguide and coupler 710. The formed trenches may have unique widths (i.e., differing from one another).

As shown in FIG. 7, waveguide and coupler 710 includes a first waveguide portion 702 and a second waveguide portion 704. In addition, waveguide and coupler 710 includes coupler hills 706(a), . . . , 706(z), collectively referred to herein as coupler hills 706, and coupler trenches 708(a), . . . , 708(z), collectively referred to herein as coupler trenches 708 disposed between coupler hills 706. As shown in FIG. 7, the respective widths of coupler trenches 708 and the width of coupler hills 706 may vary throughout waveguide and coupler 710. For example, the width of coupler hill 706(a), which is closest to first waveguide portion 702, may be smaller than the width of coupler hill 706(z), which is closest to second waveguide portion 704.

Literals used to reference individual elements in FIG. 7, e.g., (a) or (z), do not specify the number of an element or the total number of elements in sixth structure 700. Instead, they are variable references that indicate a variable element number and a variable number of total elements. For example, literal (z) used to reference coupler hill 706 (z) does not indicate that coupler hill 706(z) is the 26th coupler hill. Instead, (z) is a variable reference that could indicate any integer number. Therefore, coupler hill 706(z) is any one of coupler hills 706 and the number of coupler hills 706 in sixth structure 700 is an integer determined based on design considerations. Literals used to reference individual elements in other figures, such as FIGS. 7, 11, and 12, also do not specify the number of an element or the total number of elements, but variable references that indicate a variable element number and a variable number of total elements.

As shown in FIG. 7, coupler hills 706, first waveguide portion 702, and second waveguide portion 704 may have the same thickness or height. For example, coupler hills 706, first waveguide portion 702, and second waveguide portion 704 may have a thickness or height between 100 nm and 1 um. In some embodiments, the height may be selected to be substantially 300 nm. In other embodiments, additional etching of patterned dielectric 402 may be performed to create alternative heights and, for example, create patterned coupler hills 706 of unique heights or thicknesses. Further, some embodiments may have first waveguide portion 702 and second waveguide portion 704 thicker or thinner than coupler hills 706.

Figure 8:
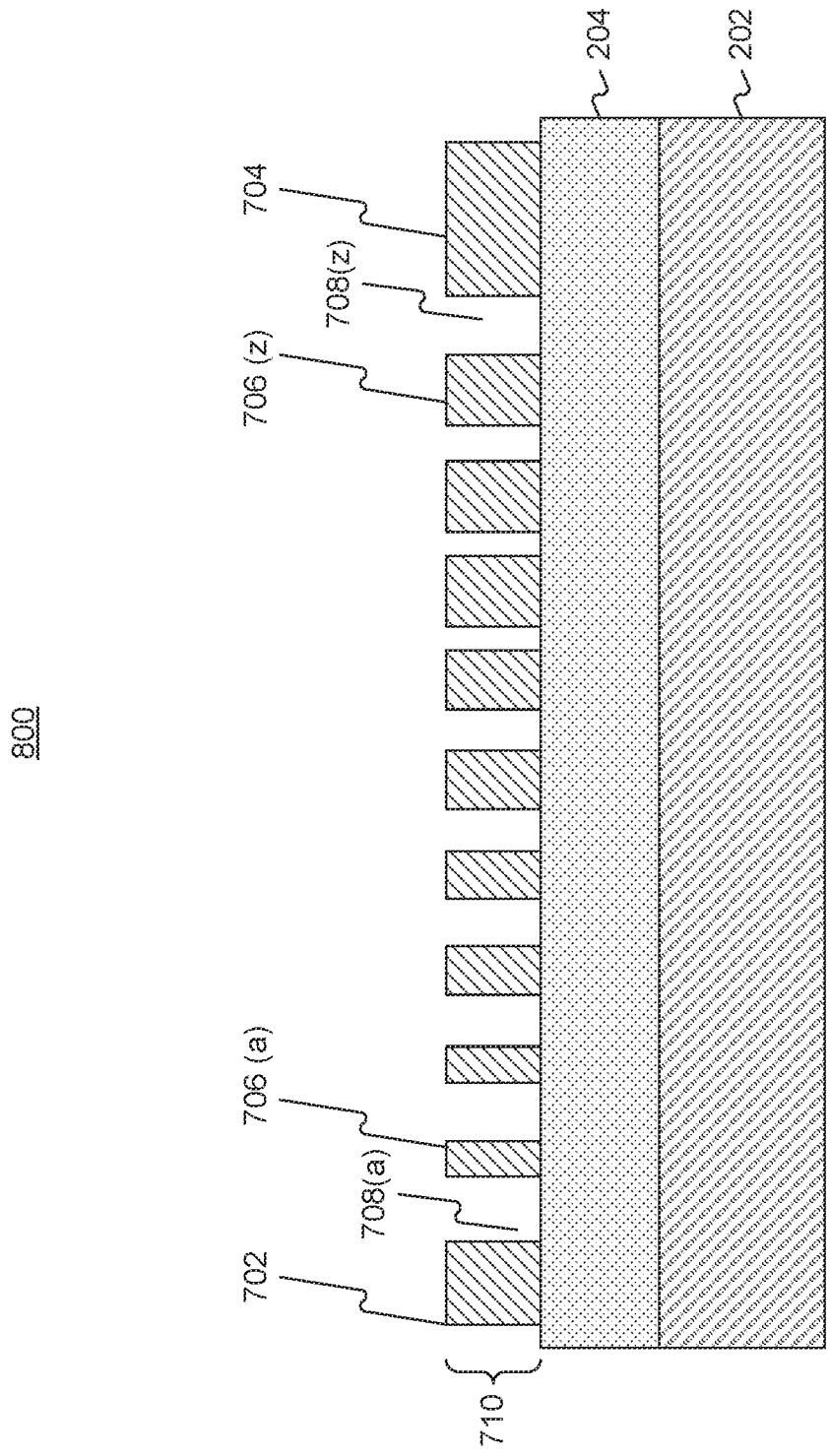

FIG. 8 shows a cross-sectional view of a seventh structure 800 formed during the exemplary manufacturing process for forming waveguide 120 and grating coupler 150 in accordance with some embodiments of the present disclosure. Seventh structure 800 includes the same elements and sixth structure 700 with the exception that grating mask 602 has been removed.

In seventh structure 800, waveguide and coupler 710 have already been formed by the etching process described in connection with FIG. 7. Disclosed embodiments contemplate creating a grating coupler with a two-step etch for generating grating structures with a shape that enhances efficiency. As further discussed below in connection with FIGS. 13-16, a second etch of the grating coupler and coupler hills 706, improves coupling efficiency and overcomes process variation issues or wavelength shifts. In preparation for a second etch of coupler hills 706, grating mask 602 can be etched to form seventh structure 800.

Grating mask 602 may be removed by a photoresist stripper or other type of organic solvent. Additionally or alternatively, removing grating mask 602 may involve selectively etching the material of grating mask 602. For example, if grating mask 602 is formed using a metallic material, grating mask 602 may be removed using an etchant that selectively etches the metallic material. Similarly, if grating mask 602 is formed using a dielectric material (different from dielectric material 206), removing grating mask 602 may include applying an etchant that selectively removes the dielectric material. Additionally or alternatively, removing grating mask 602 may involve plasma ashing.

Figure 9:
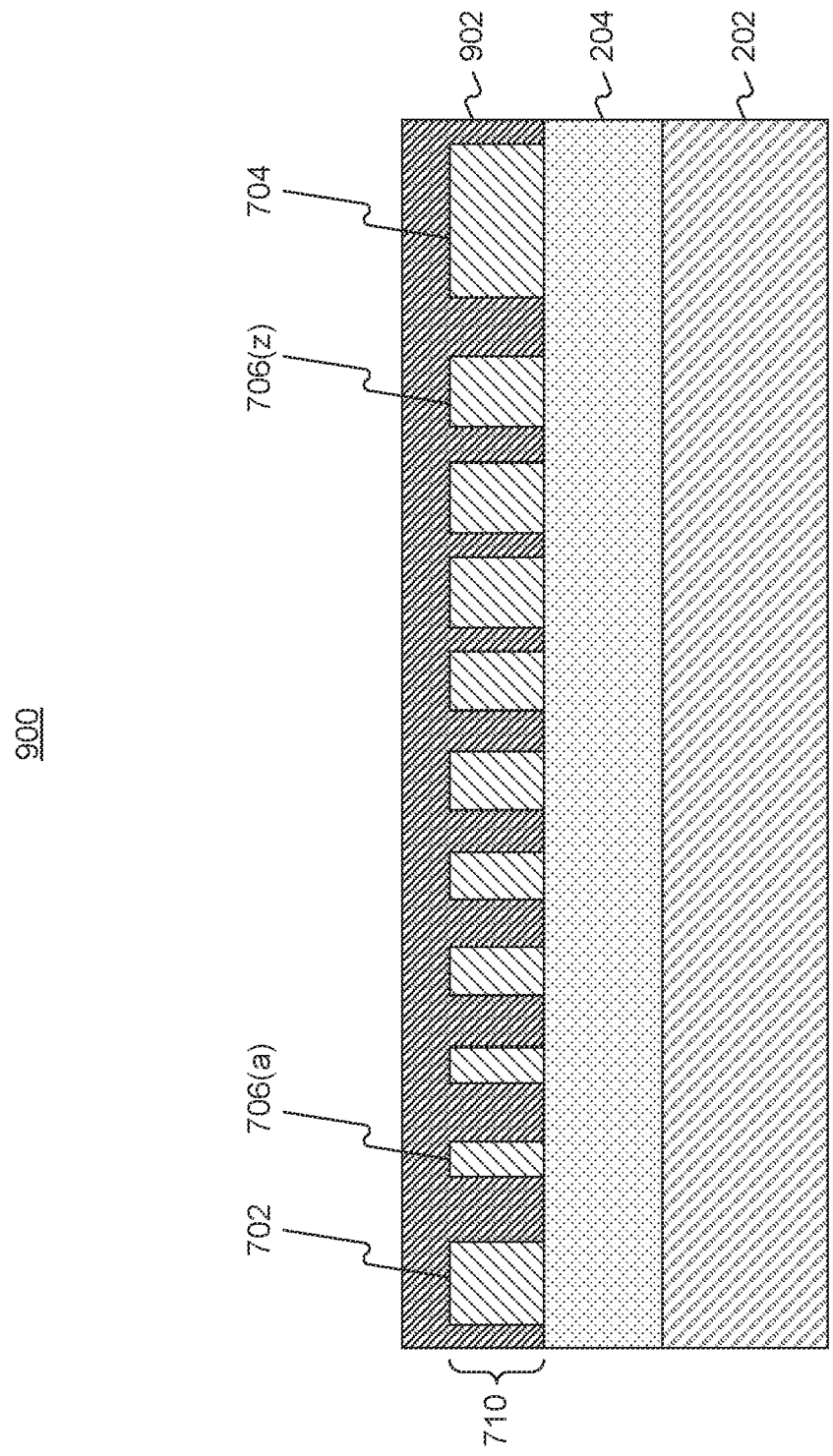

FIG. 9 shows a cross-sectional view of an eighth structure 900 formed during the exemplary manufacturing process for forming waveguide 120 and grating coupler 150 in accordance with some embodiments of the present disclosure. In addition to the elements in seventh structure 800, eighth structure 900 has a masking layer 902 that covers the entire waveguide and coupler 710 and exposed portions of the first dielectric material 204.

As shown in FIG. 9, masking layer 902 may be formed in preparation for a second etch of coupler hills 706. Positive or negative photoresist may be used for masking layer 902. Different deposition methods may be used to form masking layer 902, including, but not limited to, spin-coating and roll-type coating. In some embodiments, the thickness of masking layer 902 may be associated with the thickness of the coupler hills 706, first waveguide portion 702, and second waveguide portion 704. For example, masking layer 902 may be formed to be at least twice the thickness of coupler hills 706. In such embodiments, if coupler hills 706 have a thickness of 100 nm, masking layer 902 may be formed to be at least 200 nm. In other cases, masking layer 902 may have a thickness independent from the thickness of coupler hills 706, first waveguide portion 702, or second waveguide portion 704.

In certain embodiments, and similar to masking layer 502, masking layer 902 may be formed with materials different from photoresist. For example, masking layer 902 may be formed with dielectrics different than the one used for dielectric material 206, metals, oxide metals, or different polymers.

FIG. 10A shows a cross-sectional view of a ninth structure 1000 formed during the exemplary manufacturing process for forming waveguide 120 and grating coupler 150 in accordance with some embodiments of the present disclosure. In ninth structure 1000, masking layer 902 has been patterned to cover only a portion of the coupler hills 706, forming a second grating mask 1002.

Second grating mask 1002 may be formed by patterning masking layer 902 by methods already disclosed in connection with FIGS. 4 and 6. When masking layer 902 is formed with a photoresist layer, patterning masking layer 902 to form grating masking 1002 may include performing photolithography and developing the photoresist to form openings in the photoresist. Alternatively, patterning masking layer 902 may include mask-less photolithography, such as e-beam writing, and ion-beam writing.

Further, as also described in connection with FIGS. 4 and 6, in embodiments in which masking layer 902 is not made of photoresist, forming second grating masking 1002 may involve selective etching of the deposited material or a lift-off process.

Figure 10B:
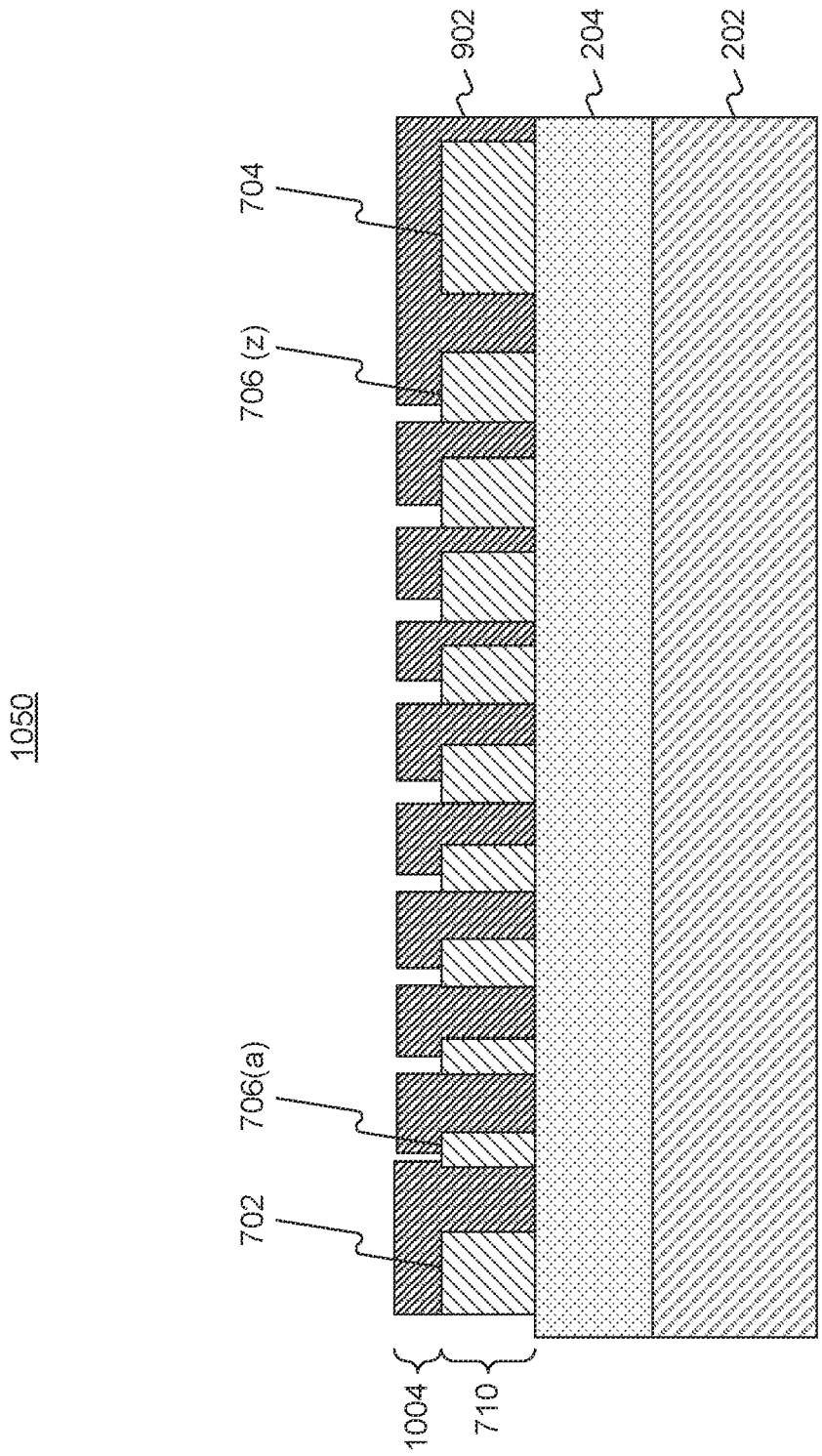
FIG. 10B shows a cross-sectional view of a tenth structure formed during the exemplary manufacturing process.

FIG. 10B shows a cross-sectional view of a tenth structure 1050 formed during the exemplary manufacturing process for forming waveguide 120 and grating coupler 150 in accordance with some embodiments of the present disclosure. Tenth structure 1050 presents a possible alternative to ninth structure 1000, that substitutes a different third grating mask 1004 for a different second grating mask 1002.

Third grating mask 1004 may be formed by a similar, or the same, process as forming second grating mask 1002. But instead of only leaving portions of masking layer 902 over coupler hills 706 (as shown in FIG. 10A), grating masking 1004 covers the entire substrate 202 and first dielectric material 204 leaving open only a portion of coupler hills 706, which will be etched in the second etch of coupler hills 706.

The selection between forming second grating mask 1002 (FIG. 10A) or third grating mask 1004 (FIG. 10B) may depend on desired wall formation and the type of etchant used for the second etch of patterned dielectric 402 (FIG. 4). For example, embodiments in which a higher angle is desired for the coupler hills 706 (as further discussed in connection with FIG. 14) may use second grating mask 1002 of FIG. 10A because the etchant will not only etch the top portion of the coupler hills 706 but also etch the side walls. Alternatively, embodiments that have substantially perpendicular side-walls, i.e., with little to no angle (or no side-etch), may elect using third grating mask 1004 of FIG. 10B because this grating only exposes the top of coupler hills 706.

Figure 11:
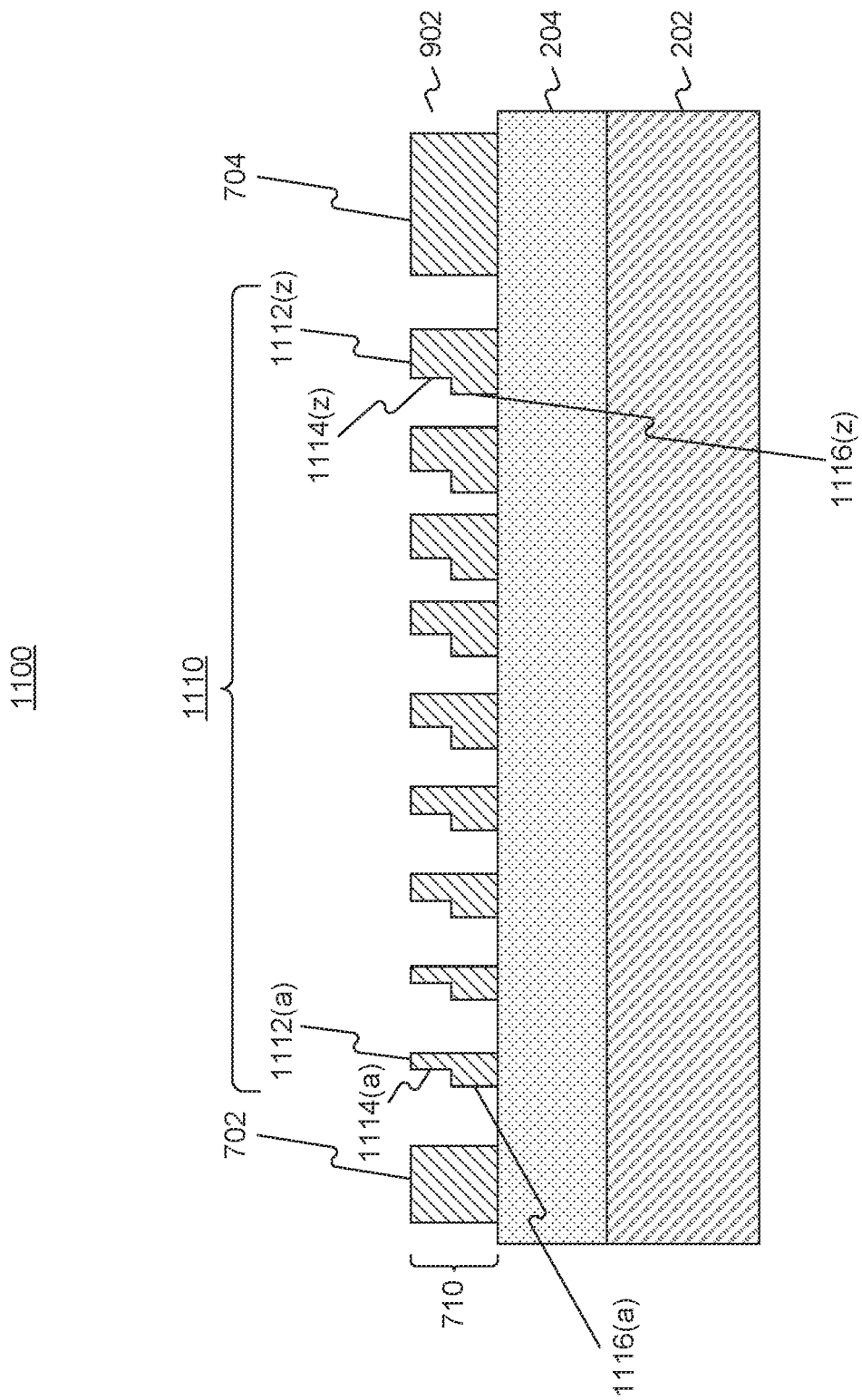

FIG. 11 shows a cross-sectional view of an eleventh structure 1100 formed during the exemplary manufacturing process for forming waveguide 120 and grating coupler 150 in accordance with some embodiments of the present disclosure. Eleventh structure 1100 may result from etching coupler hills 706 after forming second grating mask 1002 (FIG. 10A) or third grating mask 1004 (FIG. 10B). Eleventh structure 1100 includes substrate 202 and first dielectric material 204. Eleventh structure 1100 also includes waveguide and coupler 710 with first waveguide portion 702 and second waveguide portion 704. In eleventh structure 1100, however, a portion of coupler hills 706 have been etched away resulting in grating structures 1112(a) . . . 1112(z), collectively referred to herein as grating structures 1112 and forming a grating coupler 1110. In some embodiments, grating structures 1112 may be formed with silicon nitride and have a height of at least 100 nm. In other embodiments, grating structures 1112 may be formed with alternative materials described for second dielectric material 206 in connection with FIG. 2.

As discussed in connection with FIGS. 10A and 10B, second grating mask 1002 and third grating mask 1004 leave a portion of coupler hills 706 exposed. The exposed regions can be partially etched with a timed etch that removes a portion of coupler hills 706, resulting in grating structures 1112. In some embodiments, grating structures 1112 arranged in parallel and separated by trenches form grating coupler 1110. More particularly, grating structures 1112 in grating coupler 1110 may be arranged in parallel, separated by trenches, and having a periodicity selected for a targeted wavelength.

As shown in FIG. 11, grating structures 1112 have top portions 1114(a), . . . , 1114 (z), collectively referred to herein as top portions 1114, and bottom portions 1116 (a), . . . , 1116(z), collectively referred herein as bottom portions 1116. In some embodiments, as shown in FIG. 11, bottom portions 1116 may be wider than their corresponding top portions 1114 (on top of bottom portions 1116). Further, as shown in FIG. 11, bottom portions 1116 may extend past top portions 1114 in a single direction. For example, in FIG. 11 bottom portions 1116 extend towards the side of first waveguide portion 702. In other embodiments, not shown, bottom portions 1116 extend towards the side of the second waveguide portion 704. In yet other embodiments, not shown, bottom portions 1116 may extend past both sides of corresponding top portions 1114. Further, consistent with FIG. 7 in which coupler hills 706 and trenches 708 may vary, grating structures 1112 may have a varying width and spacing. Further, a height of bottom portions 1116 may be at least 1 nm, the height of bottom portions 1116 being measured from a top of first dielectric material 204 to a top of bottom portions 1116. A height of the top portions 1114 is at least 50 nm, the height of top portions 1114 being measured from the top of bottom portions 1116 to a top of top portions 1114. In some embodiments, as shown in FIG. 11, heights of top portions 1114 may be all the same. In other embodiments, not shown, heights of top portions 1114 may vary throughout the grating structures 1112. In some embodiments, as shown in FIG. 11, heights of bottom portions 1116 may be all the same. In other embodiments, not shown, heights of bottom portions 1116 may vary throughout the grating structures 1112.

Literals used to reference individual elements in FIG. 11, e.g., (a) or (z), do not specify the number of an element or the total number of elements in eleventh structure 1100. Instead, they are variable references that indicate a variable element number and a variable number of total elements. For example, literal (z) used to reference top portion 1114(z) does not indicate that top portion 1114(a) is the 26th top portion. Instead, (z) is a variable reference that could indicate any integer number.

Figure 12:
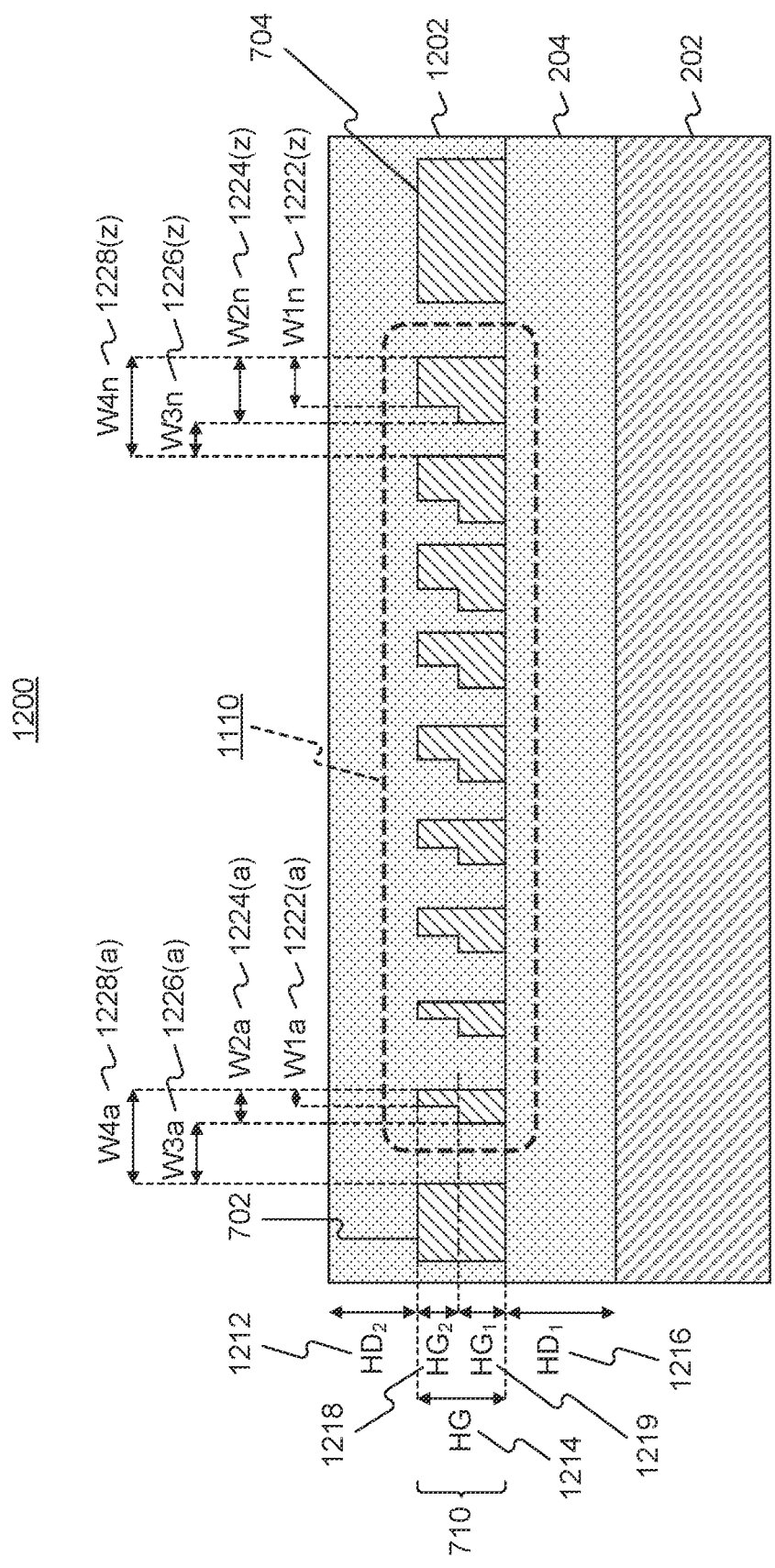

FIG. 12 shows a cross-sectional view of a twelfth structure 1200 formed during the exemplary manufacturing process for forming waveguide 120 and grating coupler 150 in accordance with some embodiments of the present disclosure. Twelfth structure 1200 may be a completed integrated photonic device that can couple light signals from an optical fiber to a waveguide and/or other components in a photonic chip, such as photonic circuit 100. In some embodiments, grating coupler 150 (FIG. 1) may be implemented using twelfth structure 1200. In some embodiments, grating coupler 150 (or a portion of grating coupler 150) and a portion of waveguide 120 (FIG. 1) may be implemented using twelfth structure 1200.

Twelfth structure 1200 may have similar elements as eleventh structure 1100, including substrate 202, first dielectric material 204, grating coupler 1110, first waveguide portion 702, and second waveguide portion 704. In addition to these elements, twelfth structure 1200 includes a dielectric material 1202. Dielectric material 1202 may be formed between grating structures 1112, filling coupler trenches 708, and on top of grating structures 1112, first waveguide portion 702, and second waveguide portion 704. Thus, dielectric material 1202 may encapsulate waveguide and coupler 710 resulting in the formation of twelfth structure 1200. Dielectric material 1202 has a top dielectric material height 1212. In some embodiments, top dielectric material height 1212 (HD$_2$) may be similar to a bottom dielectric material height 1216 (HD$_1$). For example, top dielectric material height 1212 may be within +/−10% or 25% of bottom dielectric material height 1216. In other embodiments, top dielectric material height 1212 and bottom dielectric material height 1216 may be independent.

In some embodiments, dielectric material 1202 may be formed as a conformal thick dielectric layer, thick enough to cover grating coupler 1110 and waveguide portions 702 and 704. Further, dielectric material 1202 may be selected to have the same material as first dielectric material 204. Dielectric material 1202 may be formed of silicon oxide, silicon nitride, silicon oxynitride, fluoride-doped silicate glass (FSG), a low-k dielectric material, and/or other suitable insulating material. For example, dielectric material 1202 may be formed of silicon oxide formed via CVD on substrate 202 and on grating structures 1112. Additionally or alternatively, dielectric material 1202 may be formed with one or more of sub-atmospheric chemical vapor deposition (SA-CVD), high-density plasma chemical vapor deposition (HDP-CVD), or spin on (with spin-on glass (SOG)).

After forming dielectric material 1202 as shown in FIG. 12, a chemical mechanical polish (CMP) may be performed to planarize the surface of dielectric material 1202. In some embodiments, the CMP process may be timed to achieved a desired thickness of dielectric material 1202 in twelfth structure 1200. Alternatively, in embodiments in which dielectric material 1202 is formed of oxide, dielectric material 1202 may be etched with an oxide-selective etchant to planarize or mold dielectric material 1202. In structure 1200 the dielectric layer may be formed with first dielectric material 204 and the dielectric material 1202 include silicon oxide while grating structures 1112 include silicon nitride. Additionally or alternatively, dielectric material 1202 may include a high-k dielectric, a polymer, a silicon nitride, a silicon oxynitride, or a metal oxide, among other materials.

As shown in FIG. 12, the resulting grating coupler 1110 includes a plurality of grating structures 1112 arranged in parallel. The grating structures have corresponding first widths 1222(a), . . . , 1222(z), collectively referred herein as first widths 1222, which represent the widths of top portions 1114 of the grating structures 1112. The grating structures also have corresponding second widths 1224(a), . . . , 1224(z), collectively referred herein as second widths 1224, which represent the widths of bottom portions 1116 of the grating structures 1112. As shown in FIG. 12, second widths 1224 are larger than the corresponding first widths 1222. The difference between second widths 1224 and their corresponding first widths 1222 may be controlled to be constant throughout the grating coupler 1110. For example, the difference between second widths 1224 and their corresponding first widths 1222 may be selected to be between 1 nm and 300 nm. In certain embodiments, the difference between second widths 1224 and their corresponding first widths 1222 may be selected to be substantially 270 nm. Alternatively, the difference between second widths 1224 and their corresponding first widths 1222 may be controlled to be a proportion of corresponding first width and second width. For example, first widths 1222 may be selected to be 80% of corresponding the second widths 1224. This is only an example and different proportions may be selected. Alternatively, in some embodiments the difference between first widths 1222 and corresponding second widths 1224 may be arbitrary and selected based on targeted light frequencies or selected application. As shown in FIG. 12, in some embodiments first widths 1222 and second widths 1224 may vary in grating coupler 1110.

As shown in FIG. 12, grating structures 1112 may be separated from each other and form waveguide portions by third widths 1226(a), . . . , 1226(z), collectively referred herein as third widths 1226, which represent the widths of coupler trenches 708 between grating structures 1112. As shown in FIG. 12, third widths 1226 may vary across grating coupler 1110. For example, third widths 1226 corresponding to grating structures 1112 close to first waveguide portion 702 (e.g., third width 1226(a)) are larger or wider than third widths 1226 corresponding to grating structures 1112 close to second waveguide portion 704 (e.g., third width 1226(z)).

The sums of corresponding second widths 1224, and third widths 1226 (e.g., second width 1224(a)+third width 1226(a)) represent fourth widths 1228(a), . . . , 1228(z), collectively referred herein as fourth widths 1228. The fourth widths 1228 indicate a period of grating coupler 1110. The periodicity of grating coupler 1110 can be selected based on light wavelength (or range of light wavelengths) to be coupled. Depending on the targeted wavelength(s), grating coupler 1110 may have a periodicity. For example, a period of less than 600 nm may be selected for a target wavelength of 1310 nm. Such periodicity would be embodied in fourth widths 1228. Unlike first widths 1222, second widths 1224, and third widths 1226, fourth widths 1228 can be uniform throughout grating coupler 1110. Thus, grating structures 1112 with narrow second width 1224 (e.g. grating structure 1112(a)) can have a large third width 1226 to maintain a constant fourth width 1228 that is uniform across grating coupler 1110 and based on a selected coupling wavelength. Accordingly, in some embodiments each of the plurality of grating structures 1112 may have unique first widths 1222, unique second widths 1224, and unique third widths 1226. That is, in some embodiments, each of first widths 1222, second widths 1224, and third widths 1226 may have unique values not repeated by other first widths 1222, second widths 1224, and third widths 1226 in grating coupler 1110. Moreover, the widths may be selected within a range. For example, in some embodiments first widths may be equal to or more than 170 nm and equal to or less than 370 nm, second widths may be equal to or more than 171 nm and equal to or less than 670 nm, and third widths 1226 may be equal to or more than 1 nm and equal to or less than 200 nm.

Grating structures 1112 have a height 1214 (HG). In some embodiments, the plurality of grating structures 1112 have equal height 1214. Further, height 1214 may be between 100 nm and 1000 nm. And in certain embodiments height 1214 may be selected to be 300 nm. As shown in FIG. 12, height 1214 may be uniform across all grating structures 1112. Further, waveguide portions or components, such as first waveguide portion 702 and second waveguide portion 704, may also share height 1214. In other embodiments, not shown, the height of grating structures 1112 and waveguide portions 702 and 704 may be different. For example, each of grating structures 1112(a), . . . , 1112(z), may have a unique height. In certain embodiments the height of the grating structures 1112 closer the first waveguide portion 702 may be larger than the height of grating structures 1112 closer to the second waveguide portion 704. Further, heights of first waveguide portion 702 and second waveguide portion 704 may be independent from heights of grating structures 1112 in grating coupler 1110.

Literals used to reference individual elements in FIG. 12, e.g., (a) or (z), do not specify the number of an element or the total number of elements in eleventh structure 1100. Instead, they are variable references that indicate a variable element number and a variable number of total elements. For example, literal (z) used to first width 1222(z) does not indicate that first width 1222(z) is the 26th first width. Instead, (z) is a variable reference that could indicate any integer number.

As shown in FIG. 12, in grating structures 1112, height 1214 is the sum of a top height 1218 of top portion 1114 (HG$_2$) and a bottom height 1219 (HG$_1$) of bottom portion 1116. As shown in FIG. 12, top height 1218 is measured from a top of the bottom portion 1116 to a top of the top portion 1114. Bottom height 1219 is measured from a top of the first dielectric material 204 to the top of bottom portion 1116. In some embodiments, top height 1218 may be larger than the bottom height 1219. Such configuration may facilitate coupling and/or manufacturing processes. In other embodiments, top height 1218 may be substantially the same as bottom height 1219. In other embodiments, top height 1218 may be smaller than bottom height 1219. Further, in some embodiments, top height 1218 is equal to or more than 50 nm and equal to or less than 1000 nm, while bottom height 1219 is equal to or more than 1 nm and equal to or less than 1000 nm.

While the embodiment shown in FIG. 12 shows grating structures having the same height 1214 and the same top height 1218 and a bottom height 1219, some embodiments may have varying heights. For example, in certain embodiments top height 1218 of the grating structures 1112 closer the first waveguide portion 702 (e.g., grating structure 1112(a)) may be larger than bottom height 1219. But top height 1218 of grating structures 1112 closer the second waveguide portion 704 (e.g., grating structure 1112(z)) may be smaller than bottom height 1219. Alternative combinations can be possible in which the top height 1218 and bottom height 1219 are selected and arranged according to a target application.

In some embodiments, grating structures 1112 may be arranged along an optical axis running parallel to a surface of the first dielectric material 204. For example, first waveguide portion 702 and a second waveguide portion 704 may define an optical axis or direction (e.g., from first waveguide portion 702 to second waveguide portion 704) determining the direction in which light will travel. In such embodiments, as shown in FIG. 12, first widths 1222 and second widths 1224 of the plurality of grating structures 1112 may be arranged to decrease along a direction of the optical axis and third widths 1226 may increase along the direction of the optical axis.

Figure 13:
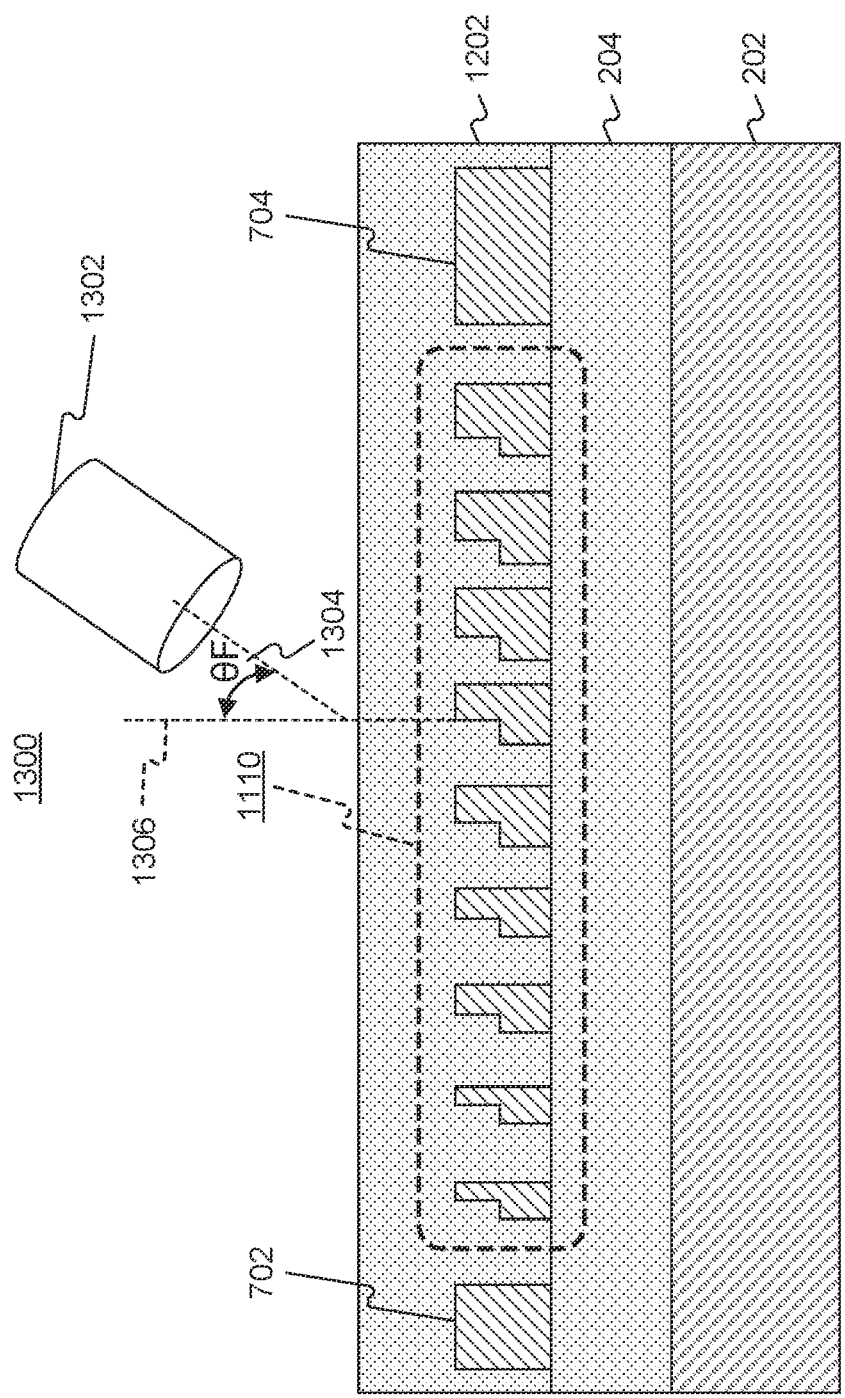
FIG. 13 shows a cross-sectional view of a photonics circuit with a grating structure and optical fiber in accordance with some embodiments of the present disclosure.

FIG. 13 shows a cross-sectional view of a photonics circuit 1300 with a grating structure and optical fiber in accordance with some embodiments of the present disclosure. Photonics circuit 1300 may be formed with twelfth structure 1200 and an optical fiber 1302. As further discussed in connection with FIG. 1, optical fibers may be positioned over gratings to couple light signals from optical fibers into a chip or from the chip into the optical fiber. Accordingly, optical fiber 1302 may be positioned over twelfth structure 1200 and particularly over grating coupler 1110.

In some embodiments, optical fiber 1302 may be positioned between 0.5 um and 50 um from the top of twelfth structure 1200. For example, optical fiber 1302 may be positioned at 20 um from the top of twelfth structure 1200.

The angle of optical fiber 1302 with respect to grating coupler 1110 may also have an influence in the coupling efficiency of grating coupler 1110. In some embodiments, optical fiber 1302 may be positioned with an incidence angle 1304 over grating coupler 1110. In some embodiments, as shown in FIG. 13, incidence angle 1304 may be measured with respect to a normal vector 1306 from the dielectric material 206 (i.e., using as a reference a vector running perpendicular to a surface of dielectric material 206). Incidence angle 1304 may be between 5-15°. Hence, in some embodiments, circuit 1300 may include optical fiber 1302 positioned at a distance equal to or more than 10 um and equal to or less than 100 um from a top of the dielectric material 1202. And optical fiber 1302 forms incidence angle 1304 to be equal to or more than 5° and equal to or less than 15° with respect to normal vector 1306 of the first dielectric material 204.

Figure 14:
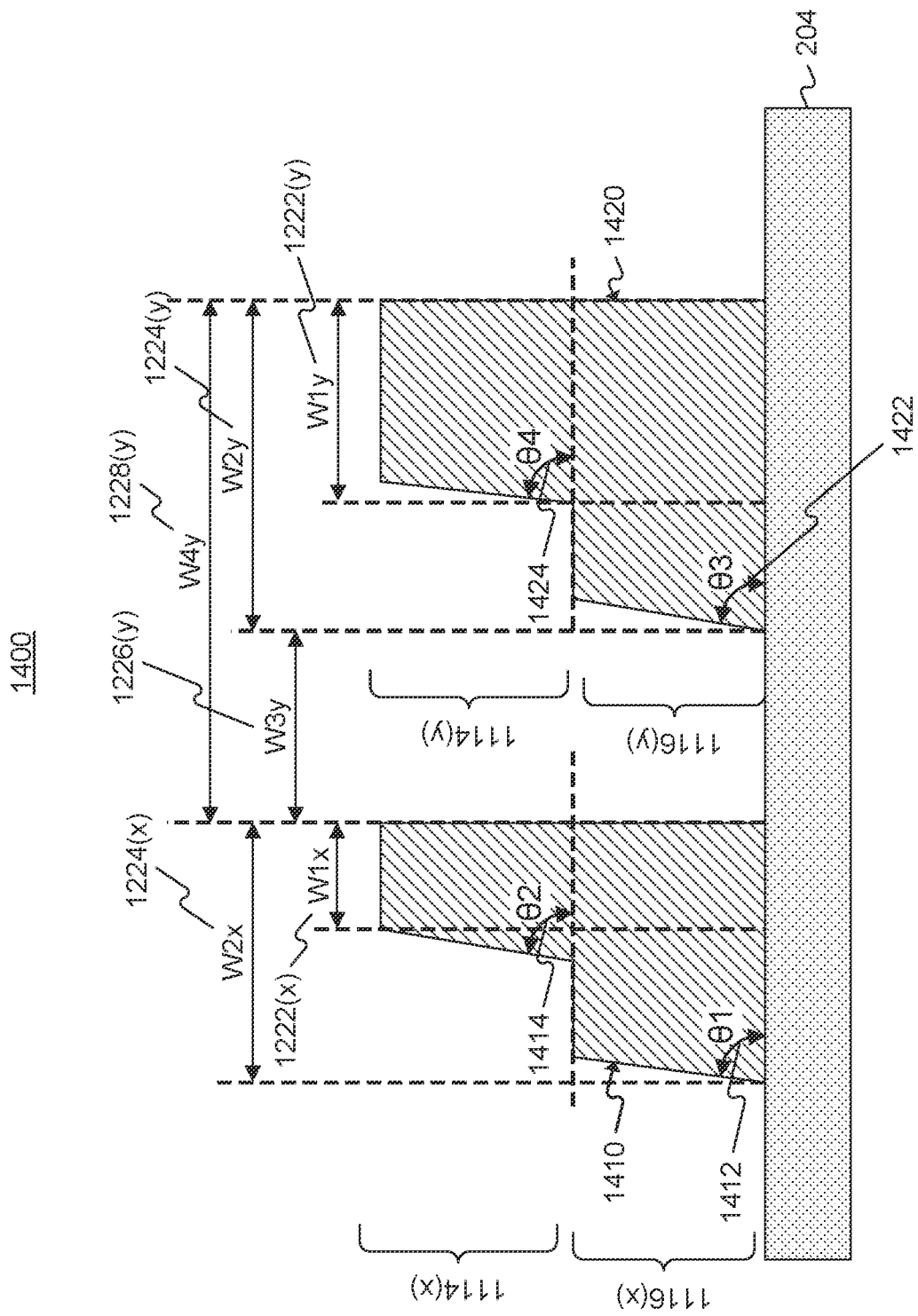
FIG. 14 shows a cross-sectional view of two exemplary grating structures in accordance with some embodiments of the present disclosure.

FIG. 14 shows a cross-sectional view of two exemplary grating structures 1410 and 1420 in accordance with some embodiments of the present disclosure. In some embodiments, grating structures 1410 and 1420 are part of grating coupler 1110 (FIG. 11). For example, grating structures 1410 and 1420 may be two of grating structures 1112 (FIG. 11). FIG. 14 shows a close up of grating structures 1410 and 1420 including additional detail about grating structures 1112 in grating coupler 1110. In other embodiments, grating structures 1410 and 1420 may be independent from grating coupler 1110.

Grating structure 1410 has a first width 1222($x$). In embodiments in which grating structure 1410 is included as part of grating coupler 1110, first width 1222($x$) corresponds to one of first widths 1222 (FIG. 12). Grating structure 1410 also has a second width 1224($x$). In embodiments in which grating structure 1410 is included as part of grating coupler 1110, second width 1224($x$) corresponds to one of second widths 1224 (FIG. 12).

Similarly, grating structure 1420 has a first width 1222($y$) and a second width 1224($y$). In embodiments in which grating structure 1420 is included as part of grating coupler 1110, first width 1222($y$) corresponds to one of first widths 1222 and second width 1224($y$) corresponds to one of second widths 1224 (FIG. 12). FIG. 14 also shows a third width 1226($y$), of a trench between grating structure 1420 and grating structure 1410. In embodiments in which grating structure 1420 is included as part of grating coupler 1110, third width 1226($y$) corresponds to one of third widths 1226 (FIG. 12). Further, FIG. 14 also shows a fourth width 1228($y$), which is the sum of second width 1224($y$) and third width 1226($y$). In embodiments in which grating structure 1420 is included as part of grating coupler 1110, fourth width 1228($y$) corresponds to one of fourth widths 1228 (FIG. 12). Further, as discussed in connection with FIG. 12, fourth width 1228($y$) may be of less than 600 nm. Thus, in certain embodiments, each of the plurality of grating structures 1112 are separated from an adjacent one of the grating structures 1112 (e.g., grating structures 1410 and 1420) by third widths 1226 and a sum of second widths 1224 and third widths 1226 is equal to or less than 600 nm. Thus, the plurality of grating structures 1112 may be arranged in intervals of less than 600 nm.

FIG. 14 shows that a side wall of grating structure 1410 at an angle with respect to a horizontal axis. In some embodiments, such horizontal axis corresponds to the surface of first dielectric material 204. In other embodiments, the angle of side walls in grating structure 1410 may be measured with respect to a different reference axis. For example, the angle of side walls may be measured with respect to a normal vector from the surface of first dielectric material 204. Alternatively, the sidewall angles may be determined based on the orientation or position of substrate 202.

As shown in FIG. 14, grating structure 1410 has a bottom portion 1116 ($x$) and a top portion 1114($x$). The sidewall of bottom portion 1116($x$) has a first angle $\theta1$ 1412 with respect to the surface of first dielectric material 204. First angle $\theta1$ 1412 may be formed during the etching processes described in connection with FIGS. 7 and 11. Alternatively, first angle $\theta1$ 1412 may be specifically formed through wet or dry etch techniques that result in angled sidewalls in microstructures. In some embodiments, first angle $\theta1$ 1412 is between 60° and 90°. For example, first angle $\theta1$ 1412 may be substantially 85°. In such embodiments, grating structures 1112 each may have first angle $\theta1$ 1412 (or grating angle) equal to or more than 60° and equal to or less than 90° with respect to a horizontal axis parallel to the surface of first dielectric material 204.

The sidewall of top portion 1114($x$) has a second $\theta2$ angle 1414 with respect to a horizontal axis parallel to the surface of first dielectric material 204. Like first angle $\theta1$ 1412, second angle $\theta2$ 1414 may be formed during the etching processes described in connection with FIGS. 7 and 11. But second angle $\theta2$ 1414 may be specifically formed through wet or dry etch techniques that specifically result in angled sidewalls in microstructures. For example, second angle $\theta2$ 1414 may be formed concurrently with first angle $\theta1$ 1412. In some embodiments, second angle $\theta2$ 1414 may be the same as first angle $\theta1$ 1412 and be between 60° and 90°. For example, like first angle $\theta1$ 1412, second angle $\theta2$ 1414 may be substantially 85°. In other embodiments, however, second angle $\theta2$ 1414 may be different from first angle $\theta1$ 1412.

As shown in FIG. 14, grating structure 1420 has a bottom portion 1116 ($y$) and a top portion 1114($y$). The sidewall of bottom portion 1116($y$) has a third angle $\theta3$ 1422 with respect to a horizontal axis parallel to the surface of first dielectric material 204. The sidewall of top portion 1114($y$) has a fourth angle $\theta4$ 1424 with respect to a horizontal axis parallel to the surface of first dielectric material 204. Like first angle $\theta1$ 1412 and second angle $\theta2$ 1414, third angle $\theta3$ 1422 and fourth angle $\theta4$ 1424 may be formed during the etching processes described in connection with FIGS. 7 and 11. Alternatively, third angle $\theta3$ 1422 and fourth angle $\theta4$ 1424 may be specifically formed through wet or dry etch techniques that result in angled sidewalls in microstructures. In some embodiments, third angle $\theta3$ 1422 and fourth angle $\theta4$ 1424 are between 60° and 90°. For example, third angle $\theta3$ 1422 and fourth angle $\theta4$ 1424 may be substantially 85°. In some embodiments, third angle $\theta3$ 1422 may be substantially the same as fourth angle $\theta4$ 1424. In other embodiments, third angle $\theta3$ 1422 may be different from fourth angle $\theta4$ 1424. Further, in some embodiments first angle $\theta1$ 1412 and second angle $\theta2$ 1414 may be related to third angle $\theta3$ 1422 and fourth angle $\theta4$ 1424. For example, third angle $\theta3$ 1422 may be substantially the same as first angle $\theta1$ 1412 while second angle $\theta2$ 1414 may be substantially the same as fourth angle $\theta4$ 1424. In some embodiments, all of first angle $\theta1$ 1412, second angle $\theta2$ 1414, third angle $\theta3$ 1422 and fourth angle $\theta4$ 1424 may have substantially the same value. In other embodiments, however, first angle $\theta1$ 1412, second angle $\theta2$ 1414, third angle $\theta3$ 1422, fourth angle $\theta4$ 1424 may have unique measurements.

Figure 15:
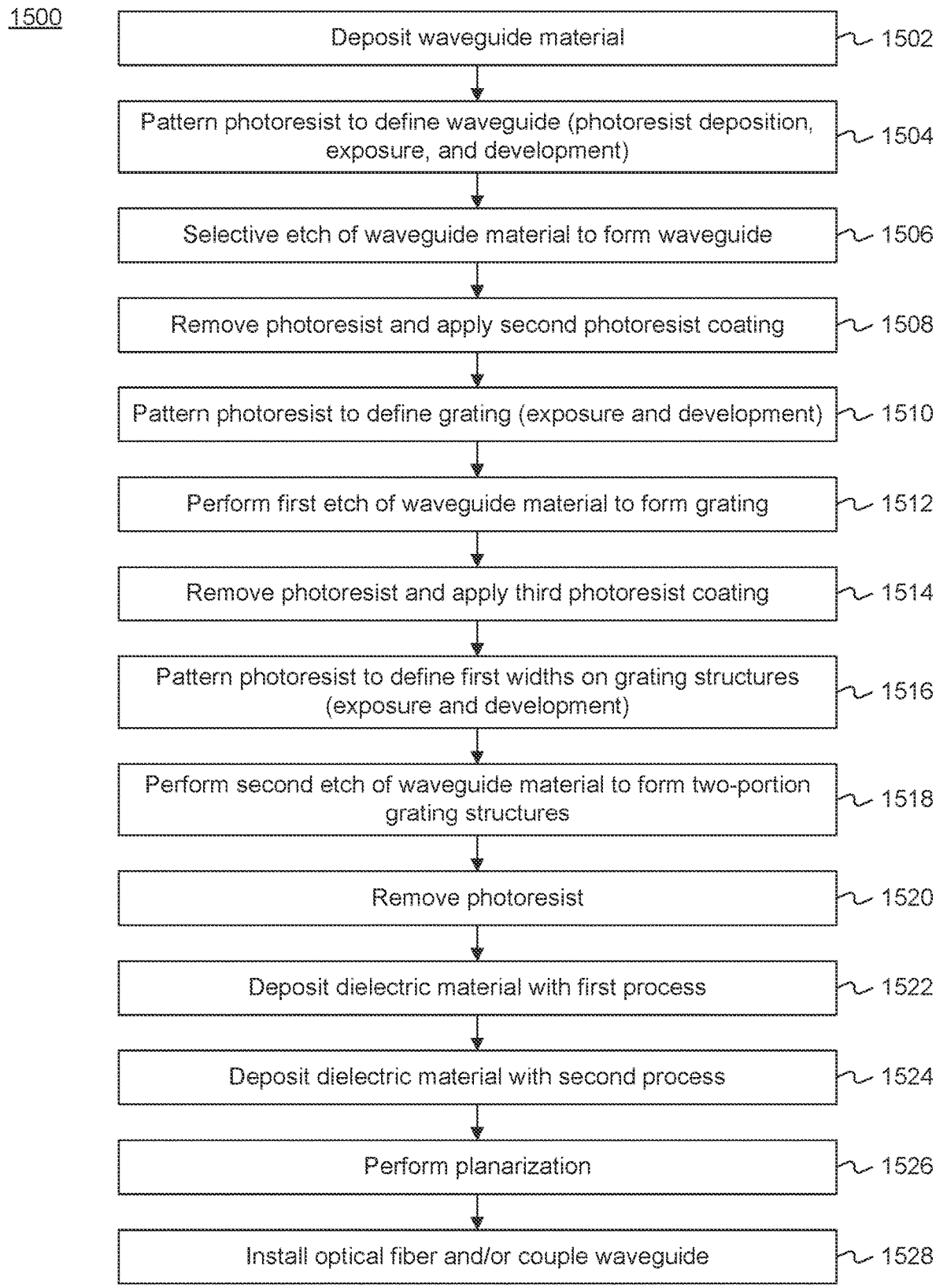
FIG. 15 is an exemplary flow chart representative of a grating coupler manufacturing process in accordance with embodiments of the present disclosure.

FIG. 15 is an exemplary flow chart representative of a grating coupler manufacturing process 1500 in accordance with embodiments of the present disclosure. The operations or steps of process 1500 are only exemplary of potential methods for the fabrication of a grating coupler, such as grating coupler 150 (FIG. 1). Additional operations can be provided before, during, and after processes or steps described in process 1500. For example, cleaning steps have not been specified in process 1500 but they could be included as part of, or between, any of the steps in process 1500. Further, some of the operations described in process 1500 may be replaced or eliminated for additional steps or operations. Moreover, the order of the operations/processes may be interchangeable.

In step 1502, a waveguide material is deposited on a substrate. For example, a silicon nitride layer or material may be deposited on a substrate using CVD processes. As discussed in connection with FIG. 2, the substrate may include a substrate (such as substrate 202 in FIG. 2) and a base layer (such as first dielectric material 204). Silicon nitride is used as an example but other dielectric materials can be used, such as silicon oxide, silicon oxynitride, high-k dielectrics, and silica, among other materials.

In step 1504, a photoresist is patterned to define a waveguide. Photoresist patterning includes deposition of photoresist (e.g., spin coating), exposure of the resist through a patterning mask (e.g., alignment and exposure for photoreaction), development of exposed photoresist to leave a photoresist pattern, and hardbake to solidify the patterned photoresist. As discussed in connection with FIG. 3, the photoresist layer can be patterned to be on top of the waveguide material deposited in step 1502.

In step 1506, the waveguide material is selectively etched. Using the patterned photoresist as a protective layer, the waveguide material (deposited in step 1502) is etched to form a waveguide on the substrate. As discussed in connection with FIG. 4, the waveguide material may be etched using an anisotropic etching process to remove waveguide material only in exposed regions (i.e., regions not covered by the patterned photoresist).

In step 1508, the patterned photoresist (formed in step 1504) is removed and a second photoresist coating is applied in preparation for a new lithography step. For example, the substrate may be immersed in a photoresist stripper to remove the patterned photoresist. Then, a new photoresist layer may be spin coated on the substrate. As discussed in connection with FIG. 5, the patterned photoresist may be removed from the top of the remaining waveguide material and a layer of photoresist is then spin coated. The new photoresist layer of step 1508 may be thicker than the layer deposited in step 1504 and be at least two times the thickness of the waveguide material. For example, in certain embodiments the thickness of the waveguide material may be about 300 nm. In such embodiments, the thickness of the photoresist layer in step 1508 may be at least 600 nm.

In step 1510, the photoresist deposited in step 1508 is patterned to define a grating. For example, the photoresist deposited in step 1508 may be exposed through a mask to cause a photoreaction. Further in step 1510, after the exposure, the photoresist may be developed to leave a patterned photoresist protecting certain regions of the waveguide material while exposing other regions of the waveguide material. As discussed in connection with FIG. 6, the photoresist patterning in step 1510 may be performed so that the width of grating structures is defined by the patterned photoresist.

In step 1512, a first etch of waveguide material is performed. For example, exposed regions of the waveguide material (i.e., regions not protected by the patterned photoresist) may be etched away to create trenches in the waveguide material and define a grating. As discussed in connection with FIG. 7, the etch of step 1512 may be a dry directional etch (such as deep RIE) for a vertical etch that removes only selected portions of the waveguide material. In some embodiments, the etch of step 1512 may be a full etch, to remove the full thickness of the waveguide material in the selected portions. In such embodiments, the trenches would have no waveguide material and the etch would reach first dielectric material 204 or substrate 202 (FIG. 7) leaving isolated grating structures from the waveguide material. In other embodiments, only a portion of the thickness of the waveguide material may be removed leaving some of the waveguide material at the bottom of the trenches. Embodiments with partial etch of the waveguide material thickness may use a timed etch while embodiments with complete etch may be untimed and use deep RIE to maintain a desired aspect ratio.

In step 1514, the patterned photoresist is removed. After etching the waveguide material to create the grating structure, the wafer may be submerged with photoresist stripper to remove the patterned photoresist. Additionally or alternatively, a photoresist ashing processes may be used to remove the photoresist using as protective layer in the etch of step 1512. As discussed in connection with FIG. 8, step 1514 results in a device that has waveguide portions and a grating.

In step 1516, a photoresist layer is deposited and patterned to define first widths over the grating structures created in step 1512. In step 1516, a photoresist layer may be spin-coated, or otherwise deposited, over the wafer. The thickness of this new photoresist layer may be similar to the photoresist in step 1508. The photoresist is then exposed to cover portions of the grating structures to define a first width. After exposure, the photoresist is developed to result in structures that cover portions of the grating structures and other portions of the waveguide material. As discussed in connection with FIGS. 10A and 10B, the photoresist layer in step 1516 may be patterned to leave only photoresist on portions of the grating structure or to only open a portion to be etched.

In step 1518, a second etch of waveguide material is performed to generate two-portion grating structures that have a top portion and a bottom portion with different widths. For example, as discussed in connection with FIG. 11, the second etch performed in step 1518 etches away portions of the grating structures while not etching the other portions of the grating structures. In some embodiments, the second etch of step 1518 may be shorter than the first etch in step 1512. Further, the second etch may be timed to avoid etching through the waveguide material and only etch a portion of the grating structure. In some embodiments, the etching process may target to remove a percentage of the thickness of the waveguide material. For example, the second etch may be configured to remove 10%, 20%, 30%, 40%, 50%, 60%, 70%, or other percentage of the waveguide thickness. In other embodiments, the second etch may target to remove a specific thickness of the waveguide. For example, the second etch may be configured to etch between 50-1000 nm of the waveguide material thickness. Thus, in some embodiments, a duration of the etch in step 1512 may be longer than a duration of the etch in step 1518, and the etch in step 1518 may be timed to remove only a portion of exposed second dielectric material 206.

In step 1520, the patterned photoresist is removed. After etching the waveguide material to create the two-portion grating structures, the wafer may be submerged with photoresist stripper to remove the patterned photoresist. Additionally or alternatively, a photoresist ashing process may be used to remove the photoresist used as a protective layer in the etch of step 1516. As discussed in connection with FIG. 11, step 1520 may result in a device that has waveguide portions and a grating with grating structures having a top portion with a first width and a bottom portion with a second with. The bottom portion being wider than the top portion.

In step 1522, a dielectric material is deposited with a first process. For example, as discussed with respect to FIG. 12, a conformal layer of silicon oxide may be deposited in the trenches of the grating structure formed in step 1520. For example, in step 1522 conformal oxide films may be deposited through multi-step sputtering (MSSP), plasma enhanced chemical vapor deposition (PECVD), or chemical mechanical polishing (CMP) to create a silicon oxide film that fills trenches in the grating structure.

In step 1524, a dielectric material is deposited with a second process. For example, once trenches of the grating structures are filled with the conformal layer, a different process may be used to deposit dielectric material on top of the grating structures to generate a top dielectric layer. For example, while the deposition process of step 1522 may use a highly conformal process (such as ALD or other multi-step CVD), the deposition process in step 1524 may be performed with a coarser and non-conformal deposition process. While in some embodiments the dielectric of step 1522 is the same as the dielectric in step 1524, in other embodiments the dielectric of step 1522 can be different than the dielectric of step 1524.

Moreover, the deposition processes of 1522 and 1524 may be merged in a single process and the same conformal deposition of step 1522 may be continued in step 1524 to generate a device or structure like the one described in connection with FIG. 11, in which the grating structure has top and bottom portions of different widths, the trenches are filled with a dielectric material, and the grating structures are covered by a top layer of the dielectric material. In some embodiments, in the structure completed in step 1524, the second dielectric material 206 includes silicon nitride, the first dielectric material 204 includes silicon oxide, and the third dielectric material 1202 includes silicon oxide.

In step 1526, a planarization process is performed to planarize the layer formed in step 1524. For example, a chemical mechanical polish (CMP) may be performed to planarize the surface of the dielectric layer. In some embodiments, a mask layer may be used as a CMP stop layer.

In step 1528, an optical fiber and/or waveguide may be installed. For example, as discussed in connection with FIG. 13, an optical fiber may be installed in a position and with an angle of incidence that allows light coupling to or from the wafer using the grating structure formed in steps 1502 to 1526 as the optical coupling mechanism. The optical fiber may be installed by fixing it at the desired position and/or angle of incidence. In some embodiments, the fiber may be fixed to a portion of the substrate or to other fixed point using adhesives, mechanical fixtures, among another mechanical attachments. In some embodiments, the optical fiber may be fixed at an angle equal to or more than 5° and equal to or less than 15° with a normal of the layer formed in step 1524 and at a distance equal to or more than 10 um and equal to or less than 100 um from the planarized layer formed in step 1524.

FIG. 16A shows an exemplary transmission characteristic 1600 of a grating coupler having a single etch in accordance with embodiments of the present disclosure. Transmission characteristic 1600 may be obtained when testing the transmission of structure 800 (FIG. 8), after the first etch of the waveguide material. Transmission characteristic 1600 has a wavelength (meters) in the x-axis and a transmission coefficient (percentage) in the y-axis.

Transmission characteristic 1600 shows that the grating structure with a single etch (i.e., without having top and bottom portions of different width), for example shown in FIG. 8, has a highest transmission coefficient at a wavelength of around 1300 nm. At this wavelength, the transmission peak is ~30% (or −5 dB).

Figure 16B:
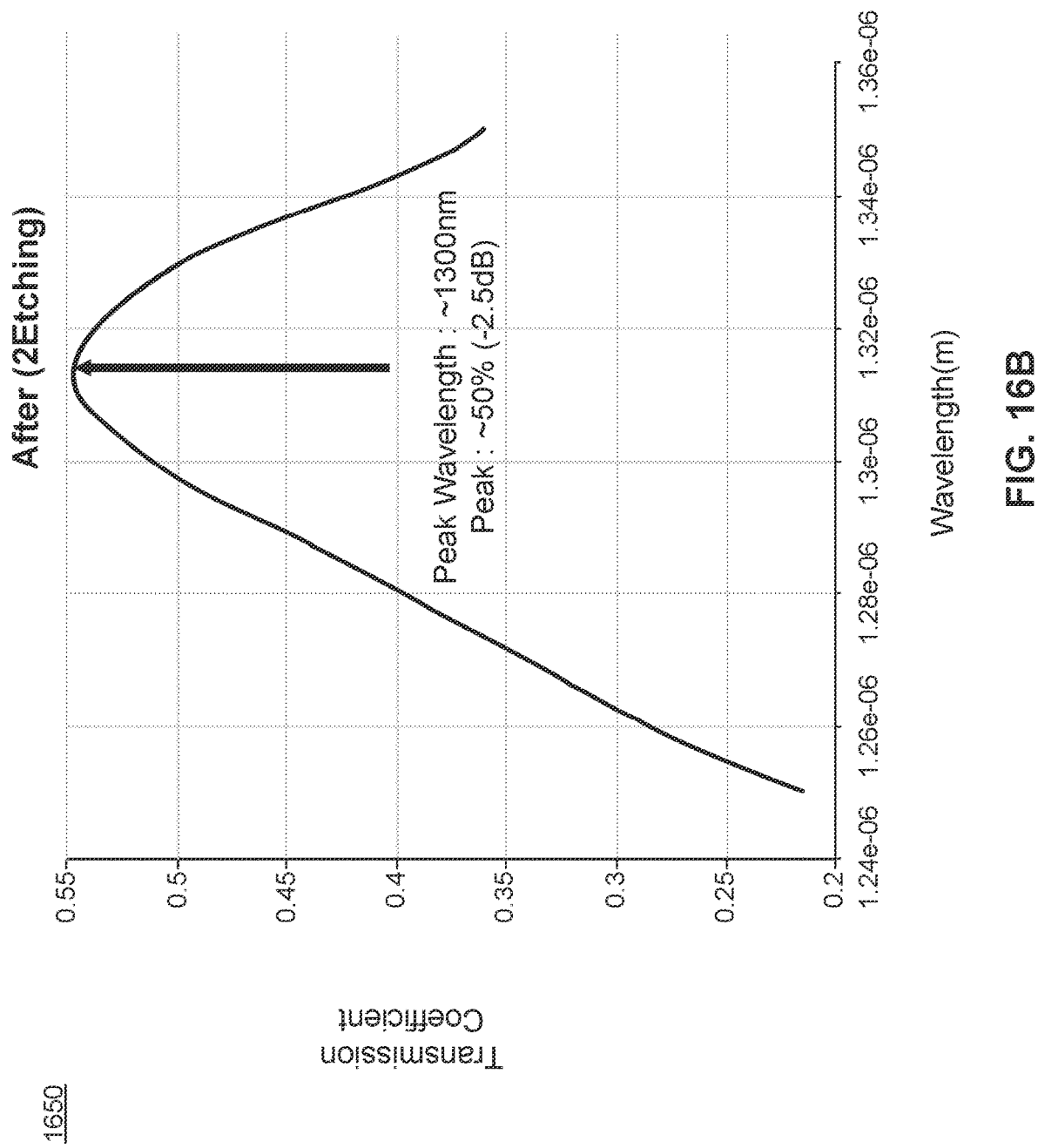
FIG. 16B shows an exemplary transmission characteristic of a grating coupler having multiple etches in accordance with embodiments of the present disclosure.

FIG. 16B shows an exemplary transmission characteristic 1650 of a grating coupler having multiple etches in accordance with embodiments of the present disclosure. Transmission characteristic 1650 may be obtained when testing the transmission of structure 1200 (FIG. 12), after the second etch of the waveguide material to generate grating structures with top and bottom portions with different heights. Like transmission characteristic 1600, transmission characteristic 1650 has a wavelength (meters) in the x-axis and a transmission coefficient (percentage) in the y-axis.

Transmission characteristic 1650 shows that the second etch of the grating structure (i.e., having top and bottom portions of different width) has better coupling and better transmission characteristics. Similar to transmission characteristic 1600, transmission characteristic 1650 also has a peak transmission at a wavelength of around 1300 nm. However the transmission coefficient is higher. While transmission characteristic 1600 had a transmission of peak of ~30% (or −5 dB), the transmission with the second etch has a peak of ~50% (or −2.5 dB).

Comparing FIGS. 16A and 16B shows that the second etch does not affect the targeted waveguide. For example, both transmission characteristic 1600 and transmission characteristic 1650 have the peak wavelength at ~1300 nm. But also comparing FIGS. 16A and 16B shows that the transmission characteristic 1650 (after $2^{nd}$ etch, to create top and bottom portions of different width) has a higher transmission rate having loss of only −2.5 dB compared to the −5 dB of the transmission characteristic 1600. FIGS. 16A and 16B show the benefit of using the two-step etch to create structures that have top portion and bottom portion with different widths. The disclosed devices, apparatus, and fabrication methods, improve the prior art by creating a grating coupler that has a more efficient transmission.

grating couplers, methods of fabrication, optical devices, and optical circuits disclosed herein improve integrated photonics by providing a high-performance grating couplers for integrated photonics applications. For example, the disclosed embodiments facilitate coupling between light elements and on-chip system or devices. For example, structure 1200 (FIG. 12) or circuit 1300 (FIG. 13) improve the coupling efficiency by having top and bottom portions in each of the grating structures with different widths. The two portions of the grating structures result in a higher coupling efficiency, minimizing light losses during transitions and improving connectivity between waveguides, fiber optics, an electronic systems or devices. As shown in FIGS. 16A and 16B, the disclosed grating structures increase transmission and reduce losses while maintaining the same targeted wavelength and preserving a similar transmission curve.

Disclosed systems and methods also facilitate testing of the photonic structures and reduce packaging costs. For example, the disclosed devices provide wafer-scale testing ability. The disclosed devices and fabrication methods allow testing of the grating structures at a wafer-level. Further, the disclosed devices and fabrication methods can be used with simple and low-cost packaging options. Thus, the disclosed devices can be implemented with low-cost packaging.

The disclosed devices and structures, such as structure 1200 or circuit 1300, also improve coupling of grating structures by tailoring angles of sidewalls and fibers to minimize light losses in integrated photonics. For example, the angle of incidence of the fiber can be selected to be between 5° and 15°. Such configuration improve coupling between the fiber and grating. Similarly, the angle of sidewalls in the grating structures can be selected to be between 60° and 90° (see FIG. 14) so that the fiber on the grating can have a higher coupling efficiency—resulting in lower losses during the transition.

The disclosed embodiments also improve frequency or wavelength selectivity during coupling or transmission. The grating structures can be fabricated with a periodicity that results in having the highest transmission in a narrow wavelength band. For example, the periodicity of the grating structures can be selected to be less than 600 nm to have a peak transmission at 1300 nm.

Moreover, the two-step etch described in the disclosed embodiments, such of the second etch of step 1518 (FIG. 15), enhances the directionality of the grating coupler. The disclosed shape of grating structures, having a narrow top portion and a wider bottom portion, improve the direction of transmission by enhancing coupling efficiency in a single direction. The disclosed grating structures not only reduce fiber light loss, they also improve directionality on the selection of a specific wavelength for transmission.

The disclosed fabrication methods also result in certain advantages over the prior art. First, the disclosed fabrication methods are easier to implement than other grating structures. Second, disclosed fabrication methods are also compatible with current CMOS technology, and they are well-suited for fabricating silicon photonics input/outputs for high-speed applications. Moreover, the disclosed structures and the fabrication methods are convenient for wafer-scale testing, and they can be used without technology dependency. Further, the disclosed fabrication methods minimize wavelength shift caused by process variations. As the grating's peak wavelength is controlled through the periodicity of grating structures and the selected wavelengths, the disclosed methods and devices provide a more robust wavelength selection.

The disclosed devices and methods are also highly adaptable. For example, the disclosed grating coupler can be adapted for any structure or gratings. That is, similar grating structures (with a narrow top portion on a wider bottom portion) can be used for different gratings targeting different wavelengths or different directionality. Accordingly, the disclosed devices and methods can be applied in multiple photonics applications For at least these reasons, the advantages of the disclosed embodiments result in grating structures with improved performance, easier fabrication and testing, and/or greater compatibility with high speed photonics applications.

It will be understood that not all advantages have necessarily been discussed herein, no particular advantage is required for all embodiments or examples, and other embodiments or examples may offer different advantages.

According to one aspect of the present disclosure, a device includes a dielectric layer, a plurality of grating structures, and a dielectric material between the plurality of grating structures and on top of the plurality of grating structures. The plurality of grating structures are arranged on the dielectric layer and separated from each other, the plurality of grating structures each having a bottom portion and top portion, the top portion having a first width and the bottom portion having a second width, the second width being larger than the first width.

According to another aspect of the present disclosure, a method for fabricating a grating structure, includes: depositing, on top of a first dielectric material, a second dielectric material (the first dielectric material being different than the second dielectric material); patterning a first photoresist layer on the second dielectric material to define a waveguide; performing a first etch of the second dielectric material to form the waveguide; patterning a second photoresist layer on the second dielectric material to define a grating; performing a second etch of the second dielectric material to form the grating including a plurality with grating structures; performing a third etch of the second dielectric material to etch a portion of each of the plurality of the grating structures; and depositing a conformal layer of a third dielectric material between and on top of the plurality of grating structures.

In accordance with yet another aspect of the present disclosure, a grating coupler for silicon photonics includes a base and a plurality of grating structures arranged on the base and separated from each other by trenches. The plurality of grating structures each has a bottom portion and a top portion, the bottom portion being wider than the top portion by a width of less than 300 nm. Further, the plurality of grating structures have a periodicity of less than 600 nm. The grating coupler also includes a dielectric material deposited in the trenches and a dielectric layer deposited over the plurality of grating structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A device comprising:
a dielectric layer;
a plurality of grating structures arranged on the dielectric layer and separated from each other, the plurality of grating structures each comprising a bottom portion and top portion, the top portion having a first width and the bottom portion having a second width, the second width being larger than the first width, the plurality of grating structures being parallel to each other and arranged between a first waveguide portion and a second waveguide portion; and
a dielectric material between the plurality of grating structures and on top of the plurality of grating structures,
wherein:
each of the plurality of grating structures is separated from an adjacent one of the grating structures by a third width;
the first widths of ones of the plurality of grating structures close to the first waveguide portion are smaller than the first widths of ones of the plurality of prating structures close to the second waveguide portion;

the second widths of the ones of the plurality of grating structures close to the first waveguide portion are smaller than the second widths of the ones of the plurality of grating structures close to the second waveguide portion;

the third widths corresponding to the ones of the grating structures close to the first waveguide portion are larger than the third widths corresponding to the ones of the grating structures close to the second waveguide portion; and sums of corresponding ones of the second widths and the third widths are uniform throughout the plurality of grating structures.

2. The device of claim 1, wherein:
the plurality of grating structures have equal height; and
a first height of the top portion is equal to or more than 50 nm and equal to or less than 1000 nm and a second height of the bottom portion is equal to or more than 1 nm and equal to or less than 1000 nm, the first height being measured from a top of the bottom portion to a top of the top portion, the second height being measured from a top of the dielectric layer to the top of the bottom portion.

3. The device of claim 1, wherein the dielectric layer and the dielectric material comprise silicon oxide and the plurality of grating structures comprise silicon nitride.

4. The device of claim 1, further comprising an optical fiber, the optical fiber being positioned at a distance equal to or more than 10 um and equal to or less than 100 um from a top of the dielectric material, the optical fiber forming an angle equal to or more than 5° and equal to or less than 15° with respect to a normal of the dielectric layer.

5. The device of claim 1, wherein
the sums are equal to or less than 600 nm.

6. The device of claim 5, wherein for each of the plurality of grating structures the first width is unique, the second width is unique, and the third width is unique.

7. The device of claim 5, wherein:
the plurality of grating structures are arranged along an optical axis running parallel to a surface of the dielectric layer;
the first width and the second width of the plurality of grating structures decreases along a direction of the optical axis; and
the third width of the plurality of grating structures increases along the direction of the optical axis.

8. The device of claim 5, wherein:
the first width is equal to or more than 170 nm and equal to or less than 370 nm;
the second width is equal to or more than 171 nm and equal to or less than 670 nm; and
the third width is equal to or more than 1 nm and equal to or less than 200 nm.

9. The device of claim 1, wherein the plurality of grating structures each have a grating angle equal to or more than 60° and equal to or less than 85° with respect to the dielectric layer.

10. The device of claim 1, wherein the dielectric layer comprises a silicon oxide layer having a thickness equal to or more than 2 um and equal to or less than 10 um.

11. The device of claim 1, wherein the plurality of grating structures are arranged in intervals of less than 600 nm.

12. The device of claim 1, wherein:
at least one sidewall of bottom portions of the plurality of grating structures has a first angle;
at least one sidewall of top portions of the plurality of grating structures has a second angle;
the first angle and the second angle are less than 85°;
the first widths are selected to be 80% of corresponding second widths; and
the first angle is different from the second angle.

13. A grating coupler for silicon photonics, comprising:
a base;
a plurality of grating structures arranged on the base and separated from each other by trenches, the plurality of grating structures each comprising a bottom portion and a top portion, the bottom portion being wider than the top portion by a width of less than 300 nm, the plurality of grating structures having a periodicity of less than 600 nm, the plurality of grating structures being parallel to each other and arranged between a first waveguide portion and a second waveguide portion;
a dielectric material deposited in the trenches; and
a dielectric layer deposited over the plurality of grating structures,
wherein:
the top portions of ones of the plurality of grating structures close to the first waveguide portion are narrower than the top portions of ones of the plurality of grating structures close to the second waveguide portion;
the bottom portions of the ones of the plurality of grating structures close to the first waveguide portion are narrower than the bottom portions of the ones of the plurality of grating structures close to the second waveguide portion;
ones of the trenches corresponding to the ones of the plurality of grating structures close to the first waveguide portion are wider than ones of the trenches corresponding to the ones of the plurality of the grating structures close to the second waveguide portion; and
sums of corresponding ones of the top portions width plus the trenches width are uniform throughout the plurality of grating structures.

14. The grating coupler of claim 13, wherein the plurality of grating structures comprise silicon nitride and have a height of at least 100 nm.

15. The grating coupler of claim 13, wherein:
each one of the trenches has a trench width that is different from widths of other of the trenches;
a height of the bottom portion is at least 1 nm, the height of the bottom portion being measured from a top of the base to a top of the bottom portion; and
a height of the top portion is at least 50 nm, the height of the top portion being measured from the top of the bottom portion to a top of the top portion.

16. The grating coupler of claim 15, wherein:
the plurality of grating structures are arranged along an optical axis running parallel to a surface of the dielectric layer; and
the trench width increases along the direction of the optical axis.

17. The grating coupler of claim 16, wherein for each of the plurality of grating structures, the trench width and the width of the bottom portion is unique.

18. The grating coupler of claim 16, wherein:
the trench width is equal to or more than 1 nm and equal to or less than 200 nm; and
the width of the bottom portion is equal to or more than 171 nm and equal to or less than 670 nm.

19. The grating coupler of claim 13, wherein the dielectric layer comprises a silicon oxide layer having a thickness equal to or more than 2 um and equal to or less than 10 um.

20. A semiconductor device comprising:
a first layer;
a plurality of grating structures arranged on the first layer and separated from each other, the plurality of grating structures each comprising a bottom portion and top portion, the top portion having a first width and the bottom portion having a second width, the second width being larger than the first width, the plurality of grating structures being parallel to each other and arranged between a first waveguide portion and a second waveguide portion; and
a dielectric material between the plurality of grating structures and on top of the plurality of grating structures,
wherein:
each of the plurality of grating structures is separated from an adjacent one of the grating structures by a third width;
the first widths of ones of the plurality of grating structures close to the first waveguide portion are smaller than the first widths of ones of the plurality of grating structures close to the second waveguide portion;
the second widths of the ones of the plurality of grating structures close to the first waveguide portion are smaller than the second widths of the ones of the plurality of grating structures close to the second waveguide portion;
the third widths corresponding to the ones of the grating structures close to the first waveguide portion are larger than the third widths corresponding to the ones of the grating structures close to the second waveguide portion; and
sums of corresponding ones of the second widths and the third widths are uniform throughout the plurality of grating structures.

* * * * *

UNITED STATES PATENT AND TRADEMARK OFFICE
CERTIFICATE OF CORRECTION

PATENT NO. : 11,953,725 B2
APPLICATION NO. : 17/446669
DATED : April 9, 2024
INVENTOR(S) : Feng-Wei Kuo et al.

It is certified that error appears in the above-identified patent and that said Letters Patent is hereby corrected as shown below:

In the Claims

In Claim 1, Column 23, Line 2, "prating structures" should read --grating structures--.

Signed and Sealed this
Fourteenth Day of May, 2024

Katherine Kelly Vidal
*Director of the United States Patent and Trademark Office*